United States Patent
Liaw

(10) Patent No.: US 11,925,011 B2
(45) Date of Patent: *Mar. 5, 2024

(54) FIN-BASED STRAP CELL STRUCTURE FOR IMPROVING MEMORY PERFORMANCE

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/873,981

(22) Filed: Jul. 26, 2022

(65) Prior Publication Data

US 2022/0359537 A1   Nov. 10, 2022

Related U.S. Application Data

(63) Continuation of application No. 15/957,708, filed on Apr. 19, 2018, now Pat. No. 11,404,423.

(51) Int. Cl.
*H01L 29/36* (2006.01)
*H01L 21/027* (2006.01)
(Continued)

(52) U.S. Cl.
CPC ......... *H10B 10/12* (2023.02); *H01L 21/0274* (2013.01); *H01L 21/30604* (2013.01);
(Continued)

(58) Field of Classification Search
CPC ............... H10B 10/12; H01L 21/0274; H01L 21/30604; H01L 21/823821; H01L 23/5226; H01L 23/528
(Continued)

(56) References Cited

U.S. PATENT DOCUMENTS 6,768,144 B2   7/2004   Houston et al.
7,586,147 B2   9/2009   Liaw
(Continued)

FOREIGN PATENT DOCUMENTS

| CN | 106409331 | 2/2017 |
| CN | 107706112 | 2/2018 |
| JP | 2014063929 | 10/2014 |

*Primary Examiner* — Ori Nadav
(74) *Attorney, Agent, or Firm* — HAYNES AND BOONE, LLP

(57) ABSTRACT

Fin-based well straps are disclosed for improving performance of memory arrays, such as static random access memory arrays. An exemplary integrated circuit (IC) device includes a FinFET disposed over a doped region of a first type dopant. The FinFET includes a first fin having a first width doped with the first type dopant and first source/drain features of a second type dopant. The IC device further includes a fin-based well strap disposed over the doped region of the first type dopant. The fin-based well strap connects the doped region to a voltage. The fin-based well strap includes a second fin having a second width doped with the first type dopant and second source/drain features of the first type dopant. The second width is greater than the first width. For example, a ratio of the second width to the first width is greater than about 1.1 and less than about 1.5.

20 Claims, 19 Drawing Sheets

(51) Int. Cl.
    *H01L 21/306* (2006.01)
    *H01L 21/8238* (2006.01)
    *H01L 23/522* (2006.01)
    *H01L 23/528* (2006.01)
    *H01L 27/02* (2006.01)
    *H01L 29/08* (2006.01)
    *H01L 29/10* (2006.01)
    *H01L 29/78* (2006.01)
    *H10B 10/00* (2023.01)

(52) U.S. Cl.
    CPC .. *H01L 21/823821* (2013.01); *H01L 23/5226* (2013.01); *H01L 23/528* (2013.01); *H01L 27/0207* (2013.01); *H01L 29/0847* (2013.01); *H01L 29/1037* (2013.01); *H01L 29/1095* (2013.01); *H01L 29/36* (2013.01); *H01L 29/7851* (2013.01)

(58) Field of Classification Search
    USPC .......................................................... 257/369
    See application file for complete search history.

(56) References Cited

U.S. PATENT DOCUMENTS

| | | | |
|---|---|---|---|
| 8,693,235 | B2 | 4/2014 | Liaw |
| 9,607,685 | B2 | 3/2017 | Liaw |
| 9,646,973 | B2 | 5/2017 | Liaw |
| 9,691,471 | B2 | 6/2017 | Liaw |
| 10,629,684 | B2 | 4/2020 | Liaw |
| 11,404,423 | B2 * | 8/2022 | Liaw ................... H01L 21/0274 |
| 2005/0111251 | A1 | 5/2005 | Liaw |
| 2013/0141963 | A1 | 6/2013 | Liaw |
| 2013/0313610 | A1 | 11/2013 | Sell |
| 2014/0048881 | A1 | 2/2014 | Kanike et al. |
| 2014/0153321 | A1 | 6/2014 | Liaw |
| 2016/0020109 | A1 | 1/2016 | Yoo |
| 2016/0049410 | A1 | 2/2016 | Seshadri et al. |
| 2016/0078922 | A1 | 3/2016 | Liaw |
| 2016/0163555 | A1 | 6/2016 | Jang et al. |
| 2016/0307803 | A1 | 10/2016 | Mun et al. |
| 2016/0372182 | A1 | 12/2016 | Liaw |
| 2017/0033016 | A1 | 2/2017 | Basker et al. |
| 2017/0033101 | A1 | 2/2017 | Sharma et al. |
| 2017/0140997 | A1 | 5/2017 | Pae et al. |
| 2017/0221548 | A1 | 8/2017 | Liaw |
| 2018/0012891 | A1 | 1/2018 | Yabuuchi et al. |
| 2018/0277442 | A1 | 9/2018 | Leobandung |

* cited by examiner

FIN-BASED STRAP CELL STRUCTURE FOR IMPROVING MEMORY PERFORMANCE

This is a continuation application of U.S. patent application Ser. No. 15/957,708, filed Apr. 19, 2018, the entire disclosure of which is incorporated herein by reference, and is related to U.S. patent application Ser. No. 16/696,999, filed Nov. 26, 2019, now U.S. Pat. No. 11,211,387, the entire disclosure of which is incorporated herein by reference and which is a divisional application of U.S. patent application Ser. No. 15/957,708.

BACKGROUND

Static random access memory ("SRAM") generally refers to any memory or storage that can retain stored data only when power is applied. As integrated circuit (IC) technologies progress towards smaller technology nodes, SRAMs often incorporate fin-based structures, such as fin-like field effect transistors (FinFETs), into SRAM cells to enhance performance, where each SRAM cell can store a bit of data. Since SRAM cell performance is largely layout dependent (for example, it has been observed that an inner SRAM cell of a SRAM array will perform differently than an edge SRAM cell of the SRAM array), fin-based well strap cells have been implemented to stabilize well potential, facilitating uniform charge distribution throughout a SRAM array, and thus uniform performance among SRAM cells of the SRAM array. However, as fin dimensions shrink, fin-based well strap cells have been observed to increase pick-up resistance and/or reduce latch-up performance of SRAM arrays. Accordingly, although existing well strap cells for SRAM arrays have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
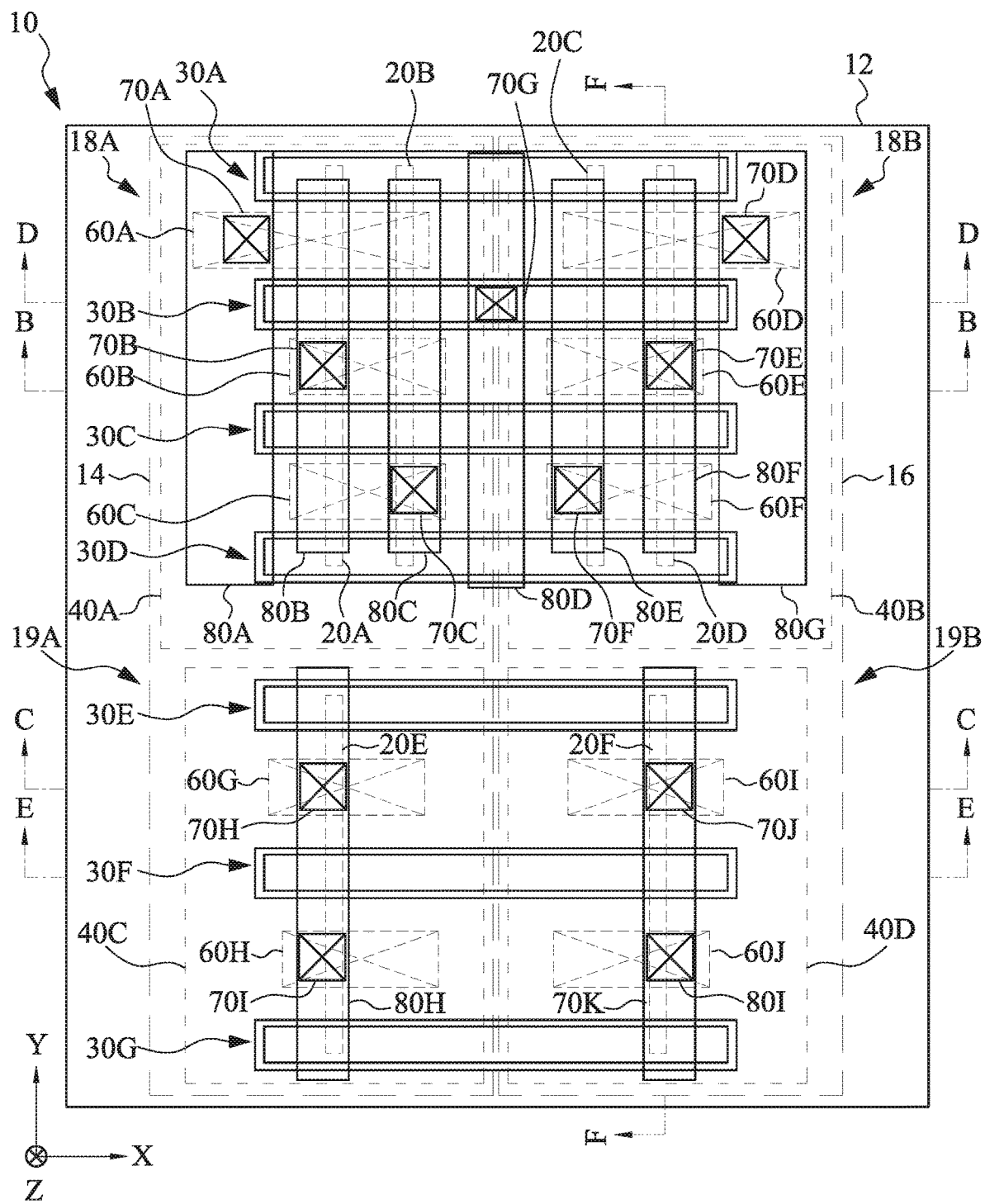
FIGS. 1A-1F are fragmentary diagrammatic views of a FinFET device, in portion or entirety, according to various aspects of the present disclosure.

The present disclosure relates generally to integrated circuit (IC) devices, and more particularly, to fin-based strap cell structures for IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, fin-like field effect transistors (FinFETs) (also referred to as non-planar transistors) have become a popular and promising candidate for high performance and low leakage applications. Memory arrays, such as static random access memory (SRAM) arrays, often incorporate FinFETs into memory cells to enhance performance, where each memory cell can store a bit of data. Memory cell performance is largely layout dependent. For example, it has been observed that an inner memory cell of a memory array will perform differently than an edge memory cell of the memory array. In some implementations, inner memory cells and edge memory cells exhibit different threshold voltages ($V_t$), different on-currents ($I_{on}$), and/or a different off-currents ($I_{off}$). Fin-based well strap cells have thus been implemented to stabilize well potential, facilitating uniform charge distribution throughout a memory array, and thus uniform performance among memory cells of the memory array. A fin-based well strap (also referred to as an electrical tie) electrically connects a well region corresponding with a FinFET of a memory cell to a voltage node (or voltage line). For example, a fin-based n-type well strap electrically connects an n-well region corresponding with a p-type FinFET to a voltage node, such as a voltage node associated with the p-type transistor, and a fin-based p-type well strap electrically connects a p-well region corresponding with an n-type FinFET to a voltage node, such as a voltage node associated with the n-type transistor.

As FinFET technologies progress towards smaller technology nodes (for example, 20 nm, 16 nm, 10 nm, 7 nm, and below), decreasing fin pitch and decreasing fin width have been observed to diminish benefits provided by fin-based well straps. For example, decreasing fin widths have been observed to increase well pickup resistance, such that a well pickup resistance of fin-based (non-planar based) well straps is much higher than a well pickup resistance of planar-based well straps. Such increases in well pickup resistance have been observed to degrade latch-up performance of memory arrays using fin-based well straps. The present disclosure thus proposes modifications to fin-based well straps that can achieve improvements in performance. For example, as described herein, increasing a width of a fin of a fin-based well strap relative to a width of a fin of a FinFET corresponding with the fin-based well strap has been observed to significantly reduce well pickup resistance associated with the fin-based well strap without affecting desired characteristics of its corresponding FinFET (for example, voltage threshold) and/or requiring significant modifications to existing fabrication techniques (for example, etch loading effects can advantageously achieve the desired width differences between well strap fins and FinFET fins). It has further been observed that reducing the well pick up resistance as described herein improves latch-up immunity of a memory array incorporating the fin-based well strap. Different embodiments may have different advantages, and no particular advantage is necessarily required of any embodiment.

Figure 1B:
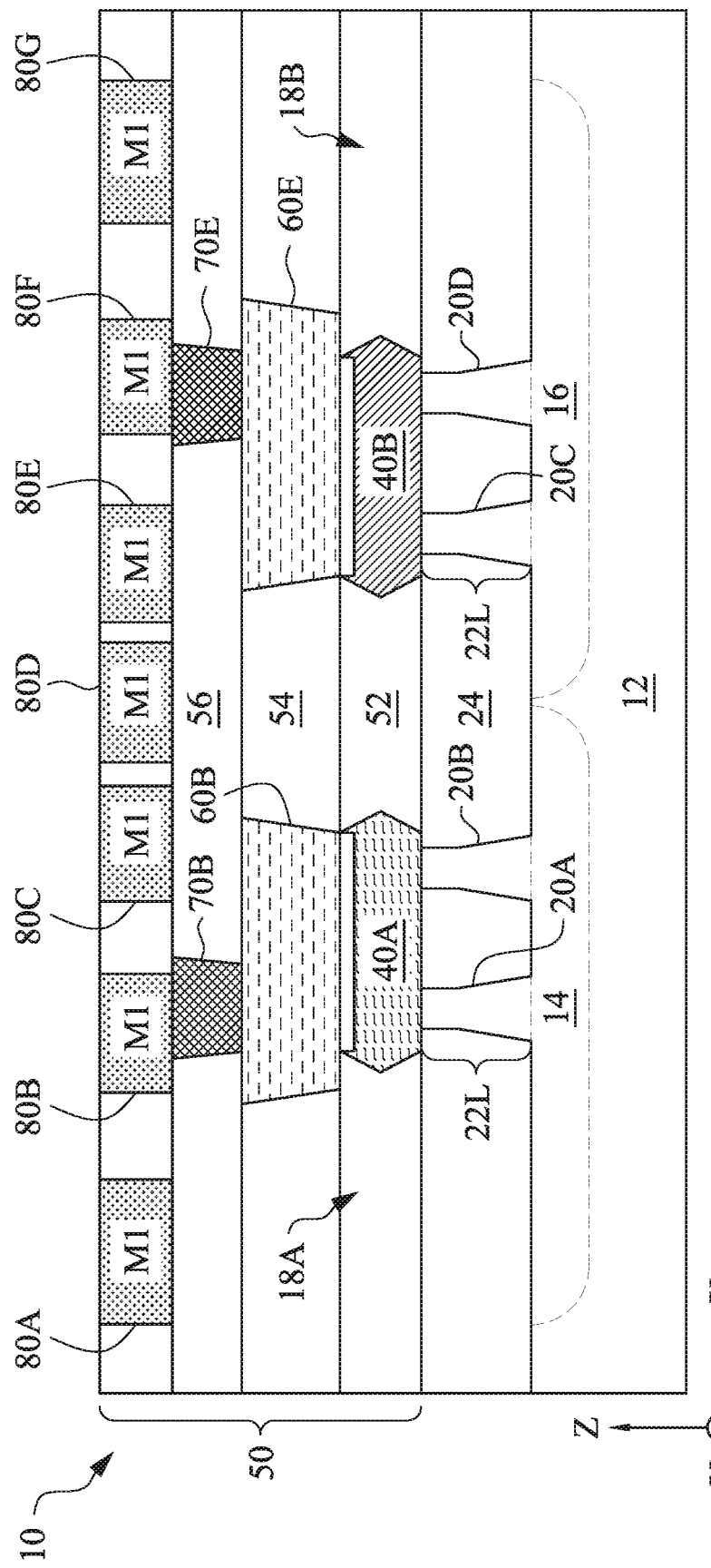
Figure 1C:
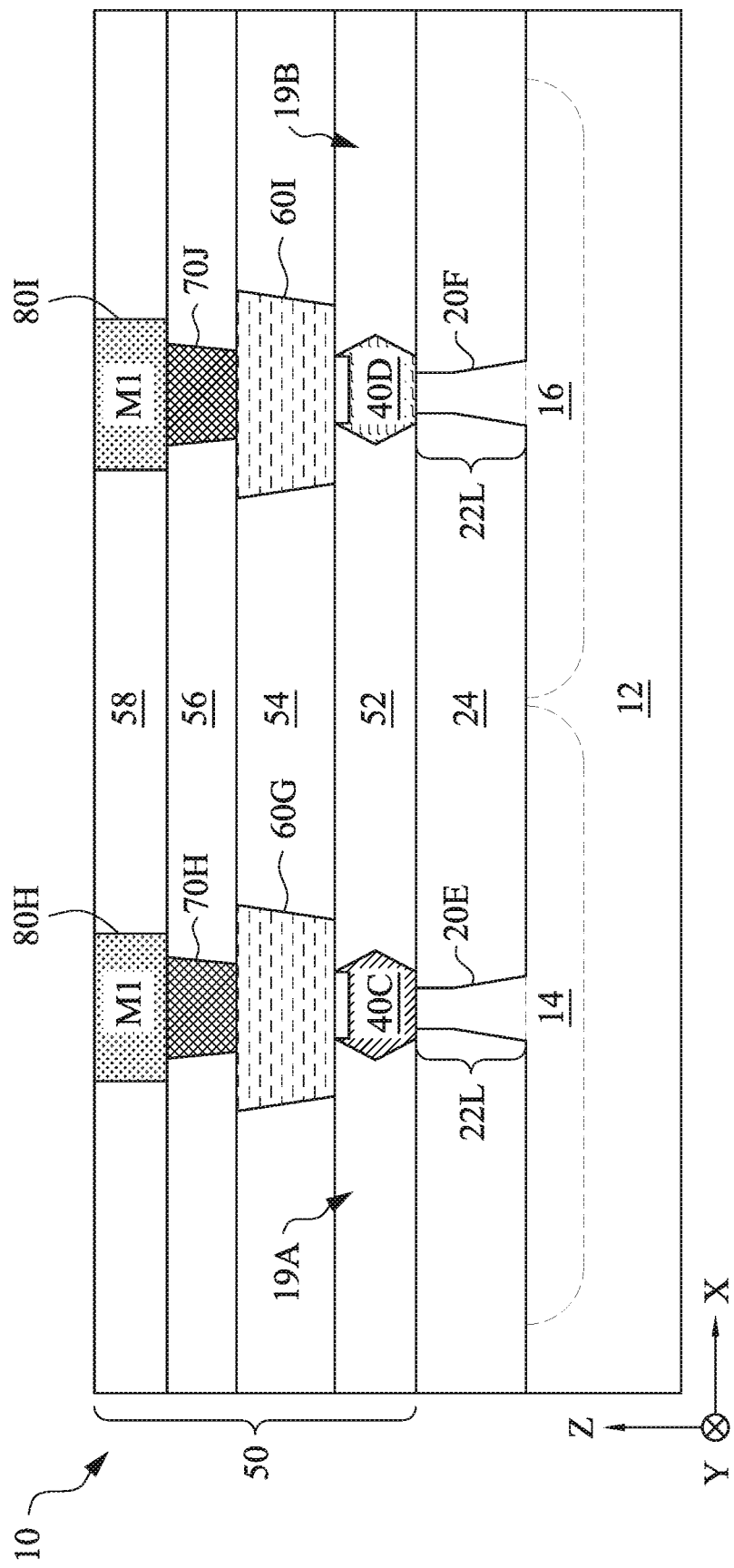
Figure 1D:
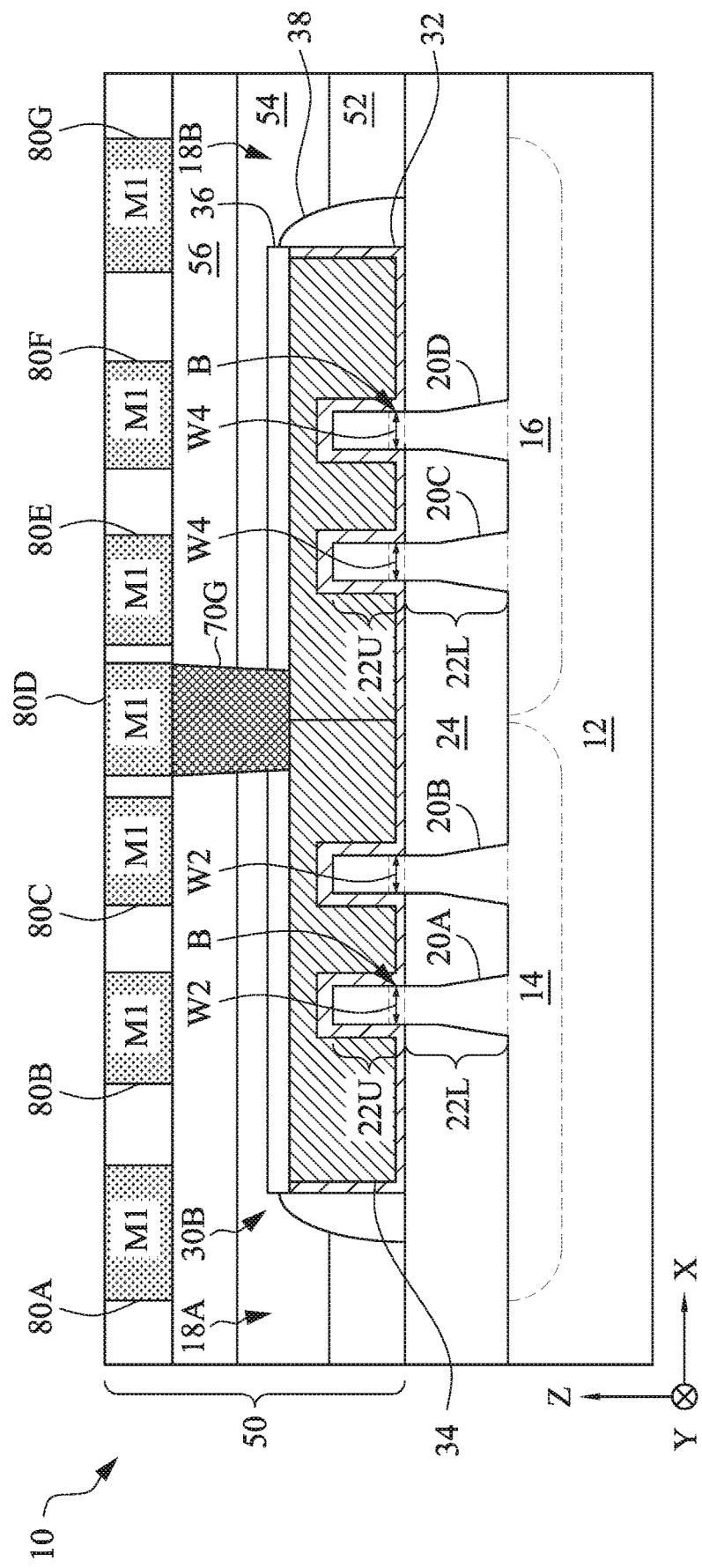
Figure 1E:
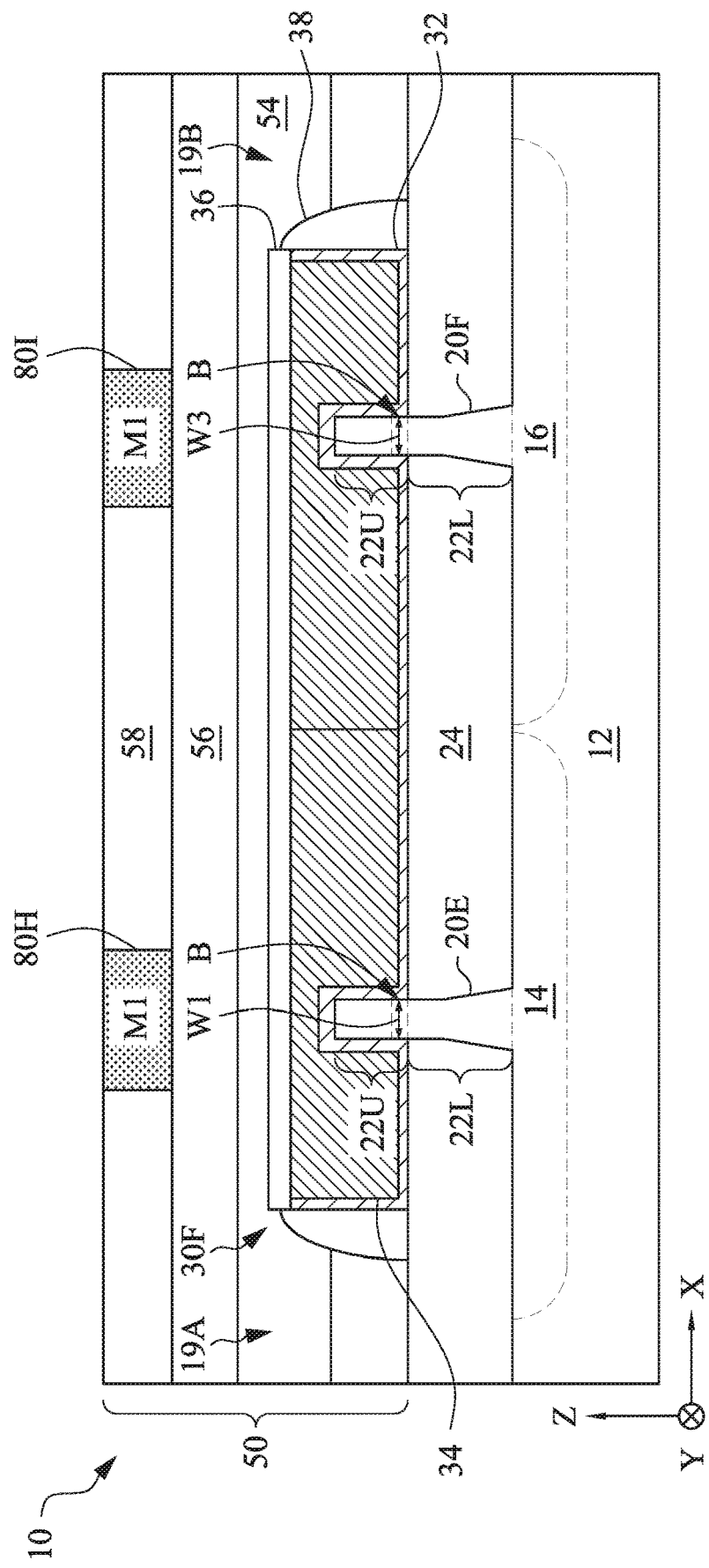
Figure 1F:
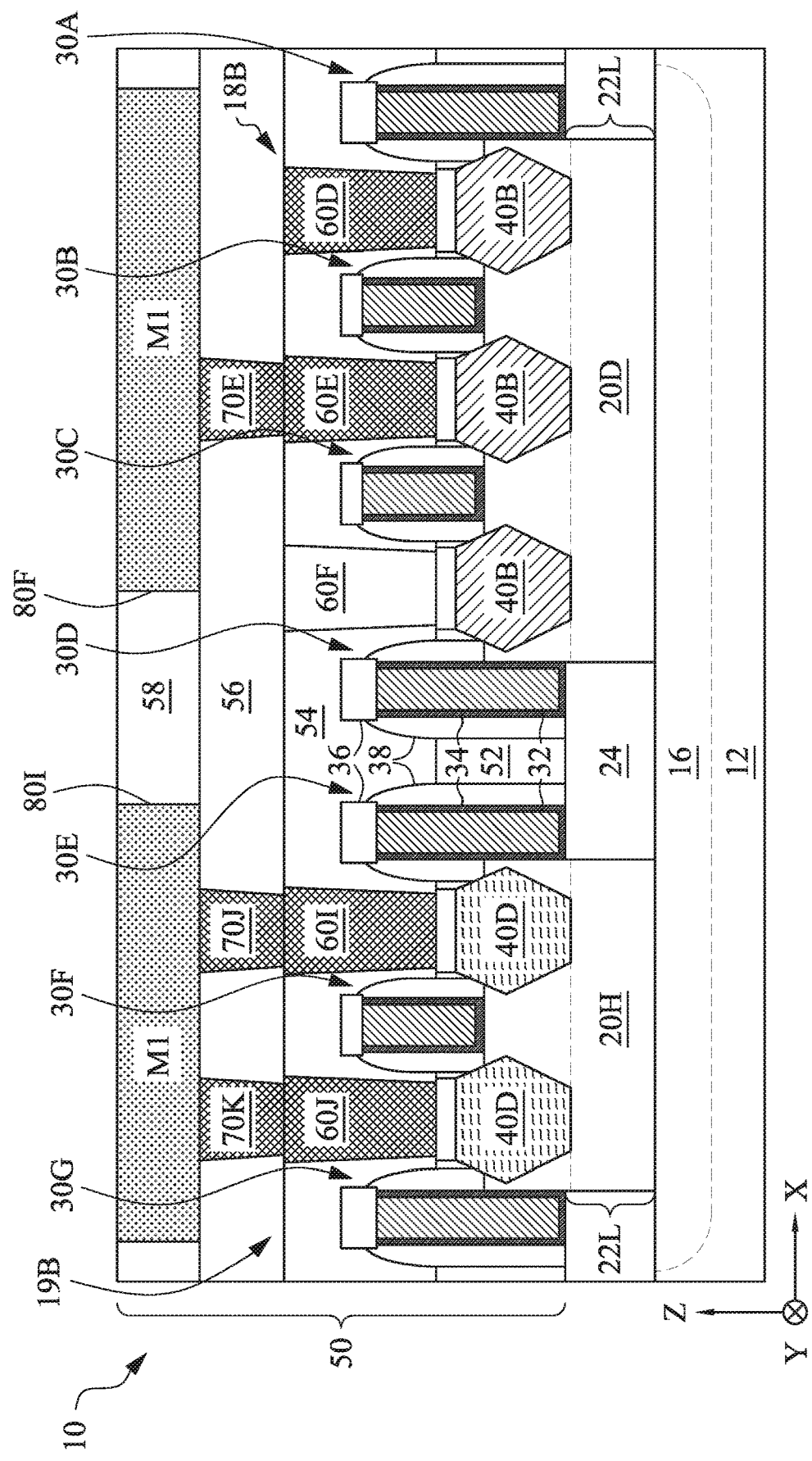

FIGS. 1A-1F are fragmentary diagrammatic views of a FinFET device 10, in portion or entirety, according to various aspects of the present disclosure. In particular, FIG. 1A is a simplified schematic top view of FinFET device 10 (for example, in an x-y plane); FIG. 1B is a diagrammatic cross-sectional view of FinFET device 10 along line 1B-1B of FIG. 1A (for example, in an x-z plane); FIG. 1C is a diagrammatic cross-sectional view of FinFET device 10 along line 1C-1C of FIG. 1A (for example, in an x-z plane); FIG. 1D is a diagrammatic cross-sectional view of FinFET device 10 along line 1D-1D of FIG. 1A (for example, in an x-z plane); FIG. 1E is a diagrammatic cross-sectional view of FinFET device 10 along line 1E-1E of FIG. 1A (for example, in an x-z plane); and FIG. 1F is a diagrammatic cross-sectional view of FinFET device 10 along line 1F-1F of FIG. 1A (for example, in a y-z plane). FinFET device 10 generally refers to any fin-based (non-planar) device, which can be included in a microprocessor, a memory cell, and/or other IC device. In some implementations, FinFET device 10 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 1A-1F have been simplified for the sake of clarity to better understand the inventive concepts of the present disclosure. Additional features can be added in FinFET device 10, and some of the features described below can be replaced, modified, or eliminated in other embodiments of FinFET device 10.

FinFET device 10 includes a substrate (wafer) 12. In the depicted embodiment, substrate 12 includes silicon. Alternatively or additionally, substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 12 includes one or more group III-V materials. In some implementations, substrate 12 includes one or more group II-IV materials.

Substrate 12 includes various doped regions configured according to design requirements of FinFET device 10. In the depicted embodiment, substrate 12 includes an n-type doped region 14 (also referred to as an n-well) and a p-type doped region 16 (also referred to as a p-well). N-type doped region 14 is configured for a p-type metal-oxide-semiconductor (PMOS) FinFET 18A, such as a pull-up (PU) FinFET, and p-type doped region 16 is configured for an n-type MOS (NMOS) FinFET 18B, such as a pull-down (PD) FinFET, such that FinFET device 10 includes a CMOS FinFET. N-type doped regions, such as n-type doped region 14, are doped with n-type dopants, such as phosphorus, arsenic, other n-type dopant, or combinations thereof. P-type doped regions, such as p-type doped region 16, are doped with p-type dopants, such as boron (for example, $BF_2$), indium, other p-type dopant, or combinations thereof. In some implementations, substrate 12 includes doped regions formed with a combination of p-type dopants and n-type dopants. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions. In furtherance of the depicted embodiment, an n-type well strap 19A is configured to electrically connect n-type doped region 14 to a first power supply voltage, such as a power supply voltage $V_{DD}$, and a p-type well strap 19B is configured to electrically connect p-type doped region 16 to a second power supply voltage, such as a power supply voltage $V_{SS}$. In some implementations, power supply voltage $V_{DD}$ is a positive power supply voltage, and power supply voltage $V_{SS}$ is an electrical ground. In some implementations, n-type doped region 14 has an n-type dopant concentration of about $5\times10^{16}$ $cm^{-3}$ to about $5\times10^{19}$ $cm^{-3}$, and p-type doped region 16 has a p-type dopant concentration of about $5\times10^{16}$ $cm^{-3}$ to about $5\times10^{19}$ $cm^{-3}$.

FinFET device 10 includes various fins disposed over substrate 12, such as a fin 20A, a fin 20B, a fin 20C, a fin 20D, a fin 20E, and a fin 20F disposed over substrate 12. In FIGS. 1A-1F, p-type FinFET 18A includes fins 20A, 20B disposed over (and electrically connected to) n-type doped region 14, n-type FinFET 18B includes fins 20C, 20D disposed over (and electrically connected to) p-type doped region 16, n-type well strap 19A includes fin 20E disposed over (and electrically connected to) n-type doped region 14, and p-type well strap 19B includes fin 20F disposed over (and electrically connected to) p-type doped region 16. P-type FinFET 18A and n-type FinFET 18B are thus multi-fin FinFETs and n-type well strap 19A and p-type well strap 19B are single fin well straps, though the present disclosure contemplates embodiments where p-type FinFET 18A, n-type FinFET 18B, n-type well strap 19A, and/or p-type well strap 19B include more or less fins). In some implementations, to enhance performance of FinFET device 10, a dopant concentration of FinFET fins is less than a doping concentration of well strap fins. For example, fins 20A, 20B of p-type FinFET 18A and fin 20E of n-type well strap 19A can include n-type dopants, where an n-type dopant concentration of fin 20E is greater than an n-type dopant concentration of fins 20A, 20B. In some implementations, the n-type dopant concentration of fin 20E is at least three times greater than the n-type dopant concentration of fins 20A, 20B. In some implementations, fins 20A, 20B have an n-type dopant concentration of about $1\times10^{15}$ cm$^{-3}$ to about $1\times10^{18}$ cm$^{-3}$, while fin 20E has an n-type dopant concentration of $1\times10^{15}$ cm$^{-3}$ to about $5\times10^{18}$ cm$^{-3}$. In some implementations, the n-type dopant concentration of n-type doped region 14 is greater than the n-type dopant concentration of fins 20A, 20B and is less than the n-type dopant concentration of fin 20E. In furtherance of the example, fins 20C, 20D of n-type FinFET 18B and fin 20F of p-type well strap 19B can include p-type dopants, where a p-type dopant concentration of fin 20F is greater than a p-type dopant concentration of fins 20C, 20D. In some implementations, the p-type dopant concentration of fin 20F is at least three times greater than the p-type dopant concentration of fins 20C, 20D. In some implementations, fins 20C, 20D have a p-type dopant concentration of about $1\times10^{15}$ cm$^{-3}$ to about $1\times10^{18}$ cm$^{-3}$, while fin 20F have a p-type dopant concentration of about $5\times10^{16}$ cm$^{-3}$ to about $5\times10^{19}$ cm$^{-3}$. In some implementations, the p-type dopant concentration of p-type doped region 16 is greater than the p-type dopant concentration of fins 20C, 20D and is less than the p-type dopant concentration of fin 20F.

Fins 20A-20F each have at least one channel region, at least one source region, and at least one drain region defined along their length in the y-direction, where a channel region is disposed between a source region and a drain region (generally referred to as source/drain regions). Channel regions include a top portion defined between sidewall portions, where the top portion and the sidewall portions engage with a gate structure (as described below), such that current can flow between the source/drain regions during operation. The source/drain regions can also include top portions defined between sidewall portions. Fins 20A, 20B of p-type FinFET 18A are oriented substantially parallel to one another, and fins 20C, 20D of n-type FinFET 18B are oriented substantially parallel to one another. Fins 20A-20F each having a width defined in an x-direction, a length defined in a y-direction, and a height defined in a z-direction. Each of fins 20A-20F includes an upper fin active region 22U (generally referring to a portion of fins 20A-20F that extends (protrudes) from a top surface of an isolation feature 24) and a lower fin active region 22L (generally referring to a portion of fins 20A-20F that extends from a top surface of substrate 12 to the top surface of isolation feature 24). To enhance performance of FinFET device 10, widths of well strap fins are greater than widths of FinFET fins. For example, widths of upper fin active regions 22U of n-type well strap 19A and p-type well strap 19B are greater than widths of upper fin active regions 22U of p-type FinFET 18A and n-type FinFET 18B. In the depicted embodiment, a width $w_1$ of fin 20E belonging to n-type well strap 19A is greater than a width $w_2$ of fins 20A, 20B belonging to p-type FinFET 18A, and a width $w_3$ of fin 20F belonging to p-type well strap 19B is greater than a width $w_4$ of fins 20C, 20D belonging to n-type FinFET 18B. Increasing widths of well strap fins (here, $w_1$, $w_3$) reduces well pick-up resistance exhibited by n-type well strap 19A and p-type well strap 19B, improving performance of FinFET device 10. Widths $w_1$-$w_4$ are defined in the channel regions respectively of fins 20A-20F. In some implementations, a width of a well strap fin is about 10% to about 50% greater than a width of a FinFET fin. For example, a ratio of a width of a well strap fin to a width of a FinFET fin (generally referred to as a fin width ratio) is about 1.1 to about 1.5, such that a ratio of $w_1$ to $w_2$ is $1.1 < w_1/w_{2 < 1.5}$ and/or a ratio of $w_3$ to $w_4$ is $1.1 < w_3/w_4 < 1.5$. In some implementations, well strap fins have substantially the same width (for example, $w_1 \approx w_3$), and FinFET fins have substantially the same width (for example, $w_2$, $w_4$).

The present disclosure contemplates variations in heights, widths, and/or lengths of fins 20A-20F that may arise from processing and fabrication of IC device 10. In the depicted embodiment, fins 20A-20F have tapered widths along their respective heights, where widths $w_1$-$w_4$ decrease along heights of fins 20A-20F. In the depicted embodiment, widths $w_1$-$w_4$ each represent an average of a varying width of respective bottom portions B of upper fin active regions 22U of fins 20A-20F. In such implementations, widths decrease from a top surface of isolation feature 24 to boundaries designating bottom portions B of upper fin active regions 22U, such that widths $w_1$-$w_4$ each represent an average of the decreasing widths of bottom portions B of upper fin active regions 22U along their heights. In some implementations, bottom portions B of upper fin active regions 22U are about a bottommost 5 nm of fins 20A-20F. In some implementations, tapering of upper fin active regions 22U, lower fin active regions 22L, and/or an entirety of well strap fins is greater than tapering of upper fin active regions 22U, lower fin active regions 22L, and/or an entirety of FinFET fins. For example, a slope of sidewalls of upper fin active region 22U of fin 20E is greater than a slope of sidewalls of upper fin active region 22U of fins 20A, 20B, and/or a slope of sidewalls of upper fin active region 22U of fin 20F is greater than a slope of sidewalls of upper fin active region 22U of fins 20C, 20D. In some implementations, widths $w_1$-$w_4$ each represent an average of a varying width of an entirety of respective upper fin active regions 22U. In such implementations, widths decrease from a top surface of isolation feature 24 to top surfaces of fins 20A-20F, such that widths $w_1$-$w_4$ each represent an average of the decreasing widths of upper fin active regions 22U along their heights. In some implementations, widths $w_1$-$w_4$ each represent an average of a varying width of top portions of respective upper fin active regions 22U. In such implementations, widths decrease from boundaries designating top portions of upper fin active regions 22U to top surfaces of fins 20A-20F, such that widths $w_1$-$w_4$ each represent an average of the decreasing widths of top portions of upper fin active regions 22U along their heights. In some implementations, widths $w_1$-$w_4$ each represent an average of a varying width of an entirety of respective fins 20A-20F. In such implementations, widths decrease from a top surface of substrate 12 to a top surface of fins 20A-20F, such that widths $w_1$-$w_4$ each represent an average of the decreasing widths of fins 20A-20F along their heights. In some implementations, widths $w_1$-$w_4$ can vary from about 5 nm to about 15 nm along fins 20A-20F depending on where widths $w_1$-$w_4$ are measured along heights of fins 20A-20F. In some implementations, fin width varies depending on a position of a fin relative to other fins and/or relative to other features of FinFET device 10. For example, widths of center fins is greater than widths of edge fins. In another example, alternatively, widths of the center fins are less than widths of the edge fins. In furtherance of such implementations, respective widths of the edge fins and the center fins can represent respective average widths of the edge fins and the center fins in any manner as described herein. Though fins 20A-20F are depicted as having tapered widths, in some implementations, fins 20A-20F have substantially the same widths along their respective heights.

In some implementations, fins 20A-20F are a portion of substrate 12 (such as a portion of a material layer of substrate 12). For example, where substrate 12 includes silicon, fins 20A-20F include silicon. Alternatively, in some implementations, fins 20A-20F are defined in a material layer, such as one or more semiconductor material layers, overlying substrate 12. For example, fins 20A-20F can include a semiconductor layer stack having various semiconductor layers (such as a heterostructure) disposed over substrate 12. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of FinFET device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a, c are different atomic percentages of silicon and b, d are different atomic percentages of germanium).

Fins 20A-20F are formed over substrate 12 using any suitable process. In some implementations, a combination of deposition, lithography and/or etching processes are performed to define fins 20A-20F extending from substrate 12 as illustrated in FIGS. 1A-1F. For example, forming fins 20A-20F includes performing a lithography process to form a patterned resist layer over substrate 12 (or a material layer, such as a heterostructure, disposed over substrate 12) and performing an etching process to transfer a pattern defined in the patterned resist layer to substrate 12 (or the material layer, such as the heterostructure, disposed over substrate 12). The lithography process can include forming a resist layer on substrate 12 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 12 (or a material layer disposed over substrate 12). The etching process can include a dry etching process (for example, a reactive ion etching (RIE) process), a wet etching process, other suitable etching process, or combinations thereof. After the etching process, the patterned resist layer is removed from substrate 12, for example, by a resist stripping process. Alternatively, fins 20A-20F are formed by a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, double patterning processes and/or multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using a self-aligned process. Then, the patterned sacrificial layer is removed, and the spacers can be used to pattern the substrate to form fins, such as fins 20A-20F. In some implementations, directed self-assembly (DSA) techniques are implemented while forming fins 20A-20F. Further, in some implementations, the exposure process can implement maskless lithography, electron-beam writing, ion-beam writing and/or nanoprint technology.

In some implementations, a patterned resist layer (or patterned mask layer) includes a well strap fin pattern defining well strap fins and a FinFET fin pattern defining FinFET fins, where the well strap fin pattern and the FinFET fin pattern define substantially the same widths for the well strap fins and the FinFET fins. In such implementations, an etching process then uses the patterned resist layer as an etch mask to remove portions of substrate 12 (or a material layer disposed over substrate 12), thereby forming fins 20A-20D corresponding with the FinFET fin pattern and fins 20E, 20F corresponding with the well strap fin pattern. Because a fin density of the well strap fin pattern (corresponding with fins 20E, 20F) is less than a fin density of the FinFET fin pattern (corresponding with fins 20A-20D), etch loading effects (which are typically disadvantageous) arising from the different density fin environments result in widths of fins 20A-20D that are less than widths of fins 20E, 20F (here, widths $w_1$-$w_4$) to achieve the advantages described herein. In some implementations, a trimming process is performed to trim fins 20A-20D, thereby reducing a width of fins 20A-20D, such that the width of fins 20A-20D is less than a width of fins 20E, 20F. The trimming process implements any suitable process for reducing the dimension of fins 20A-20D. For example, in some implementations, the trimming process includes an etching process that can selectively etch fins 20A-20D relative to other features of FinFET device 10. The etching process is a dry etching process, a wet etching process, or combinations thereof. In some implementations, a wet etching process implements an etching solution that includes ammonium hydroxide ($NH_4OH$), hydrogen peroxide ($H_2O_2$), sulfuric acid ($H_2SO_4$), tetramethylammonium hydroxide (TMAH), other suitable wet etching solution, or combinations thereof. For example, the wet etching solution can utilize an $NH_4OH:H_2O_2$ solution, an $NH_4OH:H_2O_2:H_2O$ solution (known as an ammonia-peroxide mixture (APM)), or an $H_2SO_4:H_2O_2$ solution (known as a sulfuric peroxide mixture (SPM)). In some implementations, a dry etching process implements an etchant gas that includes a fluorine-containing etchant gas (for example, $CF_4$, $SF_6$, $CH_2F_2$, $CHF_3$, and/or $C_2F_6$), an oxygen-containing gas, a chlorine-containing gas (for example, $Cl_2$, $CHCl_3$, $CCl_4$, and/or $BCl_3$), a bromine-containing gas (for example, HBr and/or $CHBR_3$), an iodine-containing gas, other suitable gases and/or plasmas, or combinations thereof. In some implementations, the trimming process implements an oxidation process. For example, the trimming process can expose fins 20A-20D to an ozone environment, thereby oxidizing a portion of fins 20A-20D, which is subsequently removed by a cleaning process and/or an etching process.

Isolation feature(s) 24 is formed over and/or in substrate 12 to isolate various regions, such as various device regions, of FinFET device 10. For example, isolation feature 24 separates and isolates active device regions and/or passive device regions from each other, such as p-type FinFET 18A, n-type FinFET 18B, n-type well strap 19A, and p-type well strap 19B. Isolation feature 24 further separates and isolates fins from one another, such as fins 20A-20F. In the depicted embodiment, isolation feature 24 surrounds a bottom portion of fins 20A-20F, thereby defining upper fin active regions 22U and lower fin active regions 22L. Isolation feature 24 includes silicon oxide, silicon nitride, silicon oxynitride, other suitable isolation material (for example, including silicon, oxygen, nitrogen, carbon, or other suitable isolation constituent), or combinations thereof. Isolation feature 24 can include different structures, such as shallow trench isolation (STI) structures, deep trench isolation (DTI) structures, and/or local oxidation of silicon (LOCOS) structures. In some implementations, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 24. In some implementations, STI features can be formed by depositing an insulator material over substrate 12 after forming fins 20A-20F, such that the insulator material layer fills gaps (trenches) between fins 20A-20F, and etching back the insulator material layer to form isolation feature 24. In some implementations, isolation feature 24 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 24 includes a dielectric layer disposed over a doped liner layer (including, for example, boron silicate glass (BSG) or phosphosilicate glass (PSG)).

Various gate structures are disposed over fins 20A-20F, such as a gate structure 30A, a gate structure 30B, a gate structure 30C, a gate structure 30D, a gate structure 30E, a gate structure 30F, and a gate structure 30G. Gate structures 30A-30G extend along the x-direction (for example, substantially perpendicular to fins 20A-20F). In the depicted embodiment, gate structures 30B, 30C are disposed over the channel regions of fins 20A-20D. In some implementations, gate structures 30B, 30C wrap respective channel regions of fins 20A-20D, thereby interposing respective source/drain regions of fins 20A-20D. Gate structures 30B, 30C engage respective channel regions of fins 20A-20D, such that current can flow between respective source/drain regions of fins 20A-20D during operation. In furtherance of the depicted embodiment, gate structure 30A wraps portions of fins 20A-20D, positioned such that a source/drain region of fins 20A-20D is disposed between gate structure 30A and gate structure 30B; gate structure 30D wraps portions of fins 20A-20D, positioned such that a source/drain region of fins 20A-20D is disposed between gate structure 30D and gate structure 30C; and gate structures 30E-30G wrap portions of fins 20E, 20F, positioned such that source/drain regions of fins 20E, 20F are disposed between gate structure 30F and gate structures 30E, 30G. In some implementations, gate structures 30B, 30C are active gate structures, whereas gate structures 30A, 30D and gate structure 30E-30G are dummy gate structures. "Active gate structure" generally refers to an electrically functional gate structure, whereas "dummy gate structure" generally refers to an electrically non-functional gate structure. In some implementations, a dummy gate structure mimics physical properties of an active gate structure, such as physical dimensions of the active gate structure, yet is electrically inoperable (in other words, does not enable current to flow between source/drain regions) in FinFET device 10. In some implementations, gate structures 30A, 30D and gate structures 30E-30F enable a substantially uniform processing environment, for example, enabling uniform epitaxial material growth in source/drain regions of fins 20A-20F (for example, when forming epitaxial source/drain features), uniform etch rates in source/drain regions of fins 20A-20F (for example, when forming source/drain recesses), and/or uniform, substantially planar surfaces (for example, by reducing (or preventing) CMP-induced dishing effects).

Gate structures 30A-30G include gate stacks configured to achieve desired functionality according to design requirements of FinFET device 10, such that gate structures 30A-30G include the same or different layers and/or materials. In the depicted embodiment, gate structures 30A-30G have gate stacks that include a gate dielectric 32, a gate electrode 34, and a hard mask layer 36. Since gate structures 30A-30D span p-type FinFET 18A and n-type FinFET 18B, gate structures 30A-30D may have different layers in regions corresponding with p-type FinFET 18A and n-type FinFET 18B. For example, a number, configuration, and/or materials of layers of gate dielectric 32 and/or gate electrode 34 corresponding with p-type FinFET 18A may be different than a number, configuration, and/or materials of layers of gate dielectric 32 and/or gate electrode 34 corresponding with n-type FinFET 18B. Further, since gate structures 30E-30G span n-type well strap 19A and p-type well strap 19B, gate structures 30E-30G may have different layers in regions corresponding with n-type well strap 19A and p-type well strap 19B. For example, a number, configuration, and/or materials of layers of gate dielectric 32 and/or gate electrode 34 corresponding with n-type well strap 19A may be different than a number, configuration, and/or materials of layers of gate dielectric 32 and/or gate electrode 34 corresponding with p-type well strap 19B.

The gate stacks of gate structures 30A-30G are fabricated according to a gate last process, a gate first process, or a hybrid gate last/gate first process. In gate last process implementations, one or more of gate structures 30A-30G include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 32 and/or gate electrode 34 are subsequently formed. In some implementations, a dummy gate stack of at least one of gate structures 30A-30G is replaced with a metal gate stack, while a dummy gate stack of at least one of gate structures 30A-30G remains. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof. A CMP process can be performed to remove any excess material of gate dielectric 32, gate electrode 34, and/or hard mask layer 36, planarizing gate structures 30A-30G.

Gate dielectric 32 is conformally disposed over fins 20A-20F and isolation feature 24, such that gate dielectric 32 has a substantially uniform thickness. In the depicted embodiment, gate dielectric 32 is disposed on sidewall surfaces and bottom surfaces of FinFET device 10 defining gate structures 30A-30G. Gate dielectric 32 includes a dielectric material, such as silicon oxide, high-k dielectric material, other suitable dielectric material, or combinations thereof. In the depicted embodiment, gate dielectric 32 includes one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HMO, HMO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). In some implementations, gate dielectric 32 further includes an interfacial layer (including a dielectric material, such as silicon oxide) disposed between the high-k dielectric layer and fins 20A-20F and isolation feature 24.

Gate electrode 34 is disposed over gate dielectric 32. Gate electrode 34 includes an electrically conductive material. In some implementations, gate electrode 34 includes multiple layers, such as one or more capping layers, work function layers, glue/barrier layers, and/or metal fill (or bulk) layers. A capping layer can include a material that prevents or eliminates diffusion and/or reaction of constituents between gate dielectric 32 and other layers of gate structures 30A-30G (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. Hard mask layer 36 is disposed over gate electrode 34 and gate dielectric 32 and includes any suitable material, such as silicon, nitrogen, and/or carbon (for example, silicon nitride or silicon carbide).

Gate structures 30A-30G further include respective gate spacers 38 disposed adjacent to (for example, along sidewalls of) the respective gate stacks. Gate spacers 38 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form gate spacers 38. In some implementations, gate spacers 38 include a multi-layer structure, such as a first dielectric layer that includes silicon nitride and a second dielectric layer that includes silicon oxide. In some implementations, gate spacers 38 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 12 and subsequently anisotropically etched to form a first spacer set adjacent to the gate stacks, and a second dielectric layer including silicon and nitrogen can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in fins 20A-20F (both of which are not shown in FIGS. 1A-1F) before and/or after forming gate spacers 38.

Epitaxial source features and epitaxial drain features (referred to as epitaxial source/drain features) are disposed over the source/drain regions of fins 20A-20F. For example, semiconductor material is epitaxially grown on fins 20A-20F, forming epitaxial source/drain features 40A-40D. In the depicted embodiment, a fin recess process (for example, an etch back process) is performed on source/drain regions of fins 20A-20F, such that epitaxial source/drain features 40A-40D are grown from lower fin active regions 22L of fins 20A-20F. In some implementations, source/drain regions of fins 20A-20F are not subjected to a fin recess process, such that epitaxial source/drain features 40A-40D are grown from and wrap at least a portion of upper fin active regions 22U of fins 20A-20F. In furtherance of the depicted embodiment, epitaxial source/drain features 40A, 40B extend (grow) laterally along the x-direction (in some implementations, substantially perpendicular to fins 20A-20D), such that epitaxial source/drain features 40A, 40B are merged epitaxial source/drain features that span more than one fin (for example, epitaxial source/drain feature 40A spans fins 20A, 20B and epitaxial source/drain feature 40B spans fins 20C, 20D). An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 20A-20F. Epitaxial source/drain features 40A-40D are doped with n-type dopants and/or p-type dopants. P-type FinFET 18A and n-type well strap 19A have oppositely doped epitaxial source/drain features, and n-type FinFET 18B and p-type well strap 19B have oppositely doped epitaxial source/drain features. In the depicted embodiment, p-type FinFET 18A and p-type well strap 19B include a p-type dopant, and n-type FinFET 18B and n-type well strap 19A include an n-type dopant. For example, for p-type FinFET 18A and p-type well strap 19B, epitaxial source/drain features 40A, 40D are epitaxial layers including silicon and/or germanium, where the silicon germanium containing epitaxial layers are doped with boron, carbon, other p-type dopant, or combinations thereof (for example, forming a Si:Ge:B epitaxial layer or a Si:Ge:C epitaxial layer). In furtherance of the example, for n-type FinFET 18B and n-type well strap 19A, epitaxial source/drain features 40B, 40C are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer). It is noted that, in FIG. 1A, epitaxial source/drain features 40A-40D are depicted as oxide definition (OD) regions, such that epitaxial source/drain features 40A, 40D can alternatively be referred to as P+ OD regions and epitaxial source/drain features 40B, 40C can alternatively be referred to as N+ OD regions. In some implementations, epitaxial source/drain features 40A-40D include materials and/or dopants that achieve desired tensile stress and/or compressive stress in the channel region. In some implementations, epitaxial source/drain features 40A-40D are doped during deposition by adding impurities to a source material of the epitaxy process. In some implementations, epitaxial source/drain features 40A-40D are doped by an ion implantation process subsequent to a deposition process. In some implementations, annealing processes are performed to activate dopants in epitaxial source/drain features 40A-40D and/or other source/drain regions of FinFET device 10, such as HDD regions and/or LDD regions (both of which are not shown in FIGS. 1A-1F). In some implementations, silicide layers are formed on epitaxial source/drain features 40A-40D. In some implementations, silicide layers are formed by depositing a metal layer over epitaxial source/drain features 40A-40D. The metal layer includes any material suitable for promoting silicide formation, such as nickel, platinum, palladium, vanadium, titanium, cobalt, tantalum, ytterbium, zirconium, other suitable metal, or combinations thereof. FinFET device 10 is then heated (for example, subjected to an annealing process) to cause constituents of epitaxial source/drain features 40A-40D (for example, silicon and/or germanium) to react with the metal. The silicide layers thus include metal and a constituent of epitaxial source/drain features 40A-40D (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process. In some implementations, the silicide layers and epitaxial source/drain features 40A-40D are collectively referred to as the epitaxial source/drain features of FinFET device 10.

A multilayer interconnect (MLI) feature 50 is disposed over substrate 12. MLI feature 50 electrically couples various devices (for example, p-type FinFET 18A, n-type finFET 18B, n-type well strap 19A, p-type well strap 19B, transistors, resistors, capacitors, and/or inductors) and/or components (for example, gate structures (for example, gate structures 30A-30G) and/or source/drain features (for example, epitaxial source/drain features 40A-40D)) of FinFET device 10, such that the various devices and/or components can operate as specified by design requirements of FinFET device 10. MLI feature 50 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 50. During operation of FinFET device 10, the interconnect features are configured to route signals between the devices and/or the components of FinFET device 10 and/or distribute signals (for example, clock signals, voltage signals, and/or ground signals) to the devices and/or the components of FinFET device 10. It is noted that though MLI feature 50 is depicted with a given number of dielectric layers and conductive layers, the present disclosure contemplates MLI feature 50 having more or less dielectric layers and/or conductive layers.

MLI feature 50 includes one or more dielectric layers, such as an interlayer dielectric layer 52 (ILD-0) disposed over substrate 12, an interlayer dielectric layer 54 (ILD-1) disposed over ILD layer 52, an interlayer dielectric layer 56 (ILD-2) disposed over ILD layer 54, and an interlayer dielectric layer 58 (ILD-3) disposed over ILD layer 56. ILD layers 52-58 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK® (Dow Chemical, Midland, Michigan), polyimide, other low-k dielectric material, or combinations thereof. In the depicted embodiment, ILD layers 52-58 are dielectric layers that include a low-k dielectric material (generally referred to as low-k dielectric layers). In some implementations, low-k dielectric material generally refers to materials having a dielectric constant (k) that is less than 3. ILD layers 52-58 can include a multilayer structure having multiple dielectric materials. MLI feature 50 can further include one or more contact etch stop layers (CESLs) disposed between ILD layers 52-58, such as a CESL disposed between ILD layer 52 and ILD layer 54, a CESL disposed between ILD layer 54 and ILD layer 56, and a CESL disposed between ILD layer 56 and ILD layer 58. In some implementations, a CESL is disposed between substrate 12 and/or isolation feature 24 and ILD layer 52. CESLs include a material different than ILD layers 52-58, such as a dielectric material that is different than the dielectric material of ILD layers 52-58. For example, where ILD layers 52-58 include a low-k dielectric material, CESLs include silicon and nitrogen, such as silicon nitride or silicon oxynitride. ILD layers 52-58 are formed over substrate 12 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 52-58 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 52-58, a CMP process and/or other planarization process is performed, such that ILD layers 52-58 have substantially planar surfaces.

Device-level contacts 60A-60J, vias 70A-70K, and conductive lines 80A-80I (collectively referred to as a metal one (M1) layer of MLI feature 50) are disposed in one or more of ILD layers 52-58 to form interconnect structures. Device-level contacts 60A-60J, vias 70A-70K, and conductive lines 80A-80I include any suitable electrically conductive material, such as Ta, Ti, Al, Cu, Co, W, TiN, TaN, other suitable conductive materials, or combinations thereof. Various conductive materials can be combined to provide device-level contacts 60A-60J, vias 70A-70K, and conductive lines 80A-80I with various layers, such as a barrier layer, an adhesion layer, a liner layer, a bulk layer, other suitable layer, or combinations thereof. In some implementations, device-level-contacts 60A-60J include Ti, TiN, and/or Co; vias 70A-70K include Ti, TiN, and/or W; and conductive lines 80A-80I include Cu, Co, and/or Ru. Device-level contacts 60A-60J, vias 70A-70K, and conductive lines 80A-80I are formed by patterning ILD layers 52-58. Patterning ILD layers 52-58 can include lithography processes and/or etching processes to form openings (trenches), such as contact openings, via openings, and/or line openings in respective ILD layers 52-58. In some implementations, the lithography processes include forming a resist layer over respective ILD layers 52-58, exposing the resist layer to patterned radiation, and developing the exposed resist layer, thereby forming a patterned resist layer that can be used as a masking element for etching opening(s) in respective ILD layers 52-58. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing top surfaces of ILD layers 52-58, device-level contacts 60A-60J, vias 70A-70K, and conductive lines 80A-80I.

Device-level contacts 60A-60J (also referred to as local interconnects or local contacts) electrically couple and/or physically couple IC device features, such as features of p-type FinFET 18A, n-type FinFET 18B, n-type well strap 19A, and p-type well strap 19B to vias 70A-70K of MLI feature 50. For example, device-level contacts 60A-60J are metal-to-device (MD) contacts, which generally refer to contacts to a conductive region, such as source/drain regions, of FinFET device 10. In the depicted embodiment, device-level contacts 60A-60C are disposed on respective epitaxial source/drain features 40A, such that device-level contacts 60A-60C physically (or directly) connect the source/drain regions of p-type FinFET 18A respectively to vias 70A-70C; and device-level contacts 60D-60F are disposed on respective epitaxial source/drain features 40B, such that device-level contacts 60D-60F physically (or directly) connect the source/drain regions of n-type FinFET 18B respectively to vias 70D-70F. In furtherance of the depicted embodiment, device-level contacts 60G, 60H are disposed on respective epitaxial source/drain features 40C, such that device-level contacts 60G, 60H physically (or directly) connect the source/drain regions of n-type well strap 19A respectively to vias 70H, 70I; and device-level contacts 60I, 60J are disposed on respective on epitaxial source/drain features 40D, such that device-level contacts 60I, 60J physically (or directly) connect the source/drain regions of p-type well strap 19B respectively to vias 70J, 70K. Device-level contacts 60A-60J extend through ILD layer 52 and/or ILD layer 54, though the present disclosure contemplates embodiments where device-level contacts 60A-60J extend through more or less ILD layers and/or CESLs of MLI feature 50. In some implementations, one or more of device-level contacts 60A-60J do not connect their source/drain regions to another electrically conductive feature of MLI feature 50, such as vias. In such implementations, the one or more of device-level contacts 60A-60J are dummy contacts, which have physical properties similar to non-dummy contacts to enable a substantially uniform processing environment.

Vias 70A-70K electrically couple and/or physically couple conductive features of MLI feature 50 to one another. In the depicted embodiment, vias 70A-70C are respectively disposed on device-level contacts 60A-60C, such that vias 70A-70C physically (or directly) connect device-level contacts 60A-60C respectively to conductive lines 80A-80C; and vias 70D-70F are respectively disposed on device-level contacts 60D-60F, such that vias 70D-70F physically (or directly) connect device-level contacts 60D-60F to conductive lines 80G-80E. Vias 70A-70C electrically couple source/drain regions of p-type FinFET 18A respectively to conductive lines 80A-80C (one of which is electrically connected to a power supply voltage $V_{DD}$ (in some implementations, configured as a positive supply voltage depending on design requirements)), and vias 70D-70F electrically couple source/drain regions of n-type FinFET 18B respectively to conductive lines 80G-80E (one of which is electrically connected to a power supply voltage $V_{SS}$ (in some implementations, configured as ground and/or a negative supply voltage). In furtherance of the depicted embodiment, vias 70H, 70I are disposed respectively on device-level contacts 60G, 60H, such that vias 70H, 70I physically (or directly) connect device-level contacts 60G, 60H to conductive line 80H; and vias 70J, 70K are respectively disposed on device-level contacts 60I, 60J, such that vias 70J, 70K physically (or directly) connect device-level contacts 601, 60J to conductive line 80I. Vias 70H, 70I electrically couple source/drain regions of n-type well strap 19A to conductive line 80H (which is electrically connected to power supply voltage $V_{DD}$), and vias 70J, 70K electrically couple source/drain regions of p-type well strap 19B to conductive line 80I (which is electrically connected to power supply voltage $V_{SS}$). Vias 70A-70F and vias 70H-70K extend through ILD layer 54, though the present disclosure contemplates embodiments where vias 70A-70F and vias 70H-70K extend through more or less ILD layers and/or CESLs of MLI feature 50. In some implementations, MLI feature 50 further includes vias that interconnect conductive lines 80A-80I (in other words, the M1 layer) to conductive lines disposed in other ILD layers (such as a metal two (M2) layer of MLI feature 50, not shown) overlying ILD layers 52-58, thereby electrically and/or physically coupling the M1 layer to the M2 layer.

Via 70G electrically couples and/or physically couples an IC device feature to a conductive feature of MLI feature 50. In FIGS. 1A-1F, via 70G is disposed on gate structure 30B, such that via 70G physically (or directly) connects gate structure 30B to conductive line 80D. Via 70G extends through ILD layer 54 and ILD layer 56, though the present disclosure contemplates embodiments where via 70G extends through more or less ILD layers and/or CESLs of MLI feature 50. In such implementations, via 70G is physically and electrically coupled with gate structure 30B. In alternative implementations, MLI feature 50 further includes a device-level contact that electrically couples and/or physically couples gate structure 30B to via 70G. For example, the device-level contact is disposed on gate structure 30B, such that the device-level contact physically (or directly) connects gate structure 30B to via 70G, and via 70G physically (or directly) connects the device-level contact to conductive line 80D. Such device-level contact is thus referred to as a gate contact (CG) or metal-to-poly (MP) contact, which generally refers to a contact to a gate structure, such as a poly gate structure or a metal gate structure. In such implementations, the device-level contact extends through ILD layer 52 and ILD layer 54, and via 70G extends through ILD layer 56, though the present disclosure contemplates embodiments where the device-level contact and/or via 70G extend through more or less ILD layers and/or CESLs of MLI feature 50.

Figure 2:
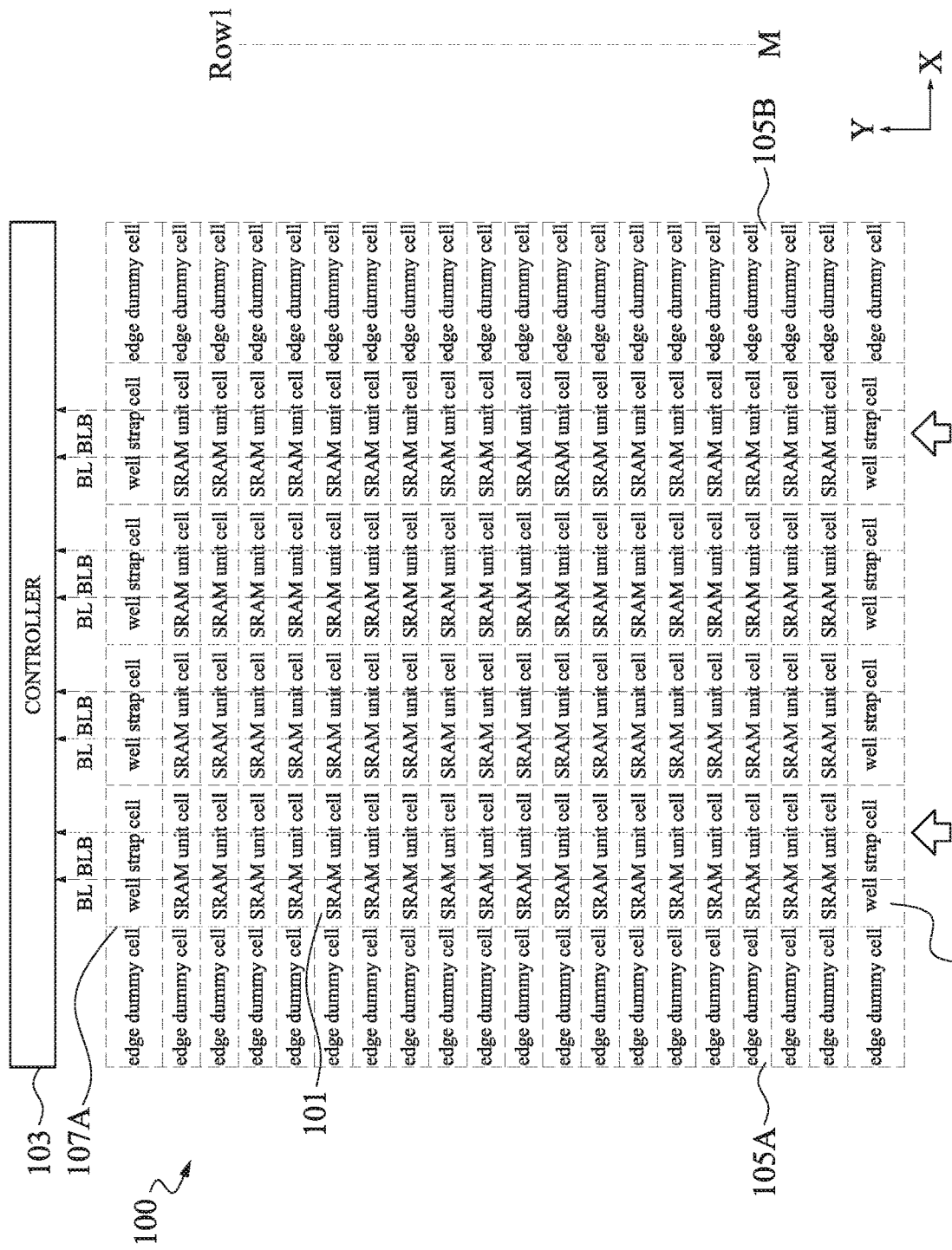
FIG. 2 is a diagrammatic plan view of a memory array, in portion or entirety, according to various aspects of the present disclosure.

Well straps, such as n-type well strap 19A and p-type well strap 19B, can be implemented in memory arrays to improve performance. FIG. 2 is a diagrammatic plan view of a memory array 100, which can implement well straps configured as described herein, according to various aspects of the present disclosure. In the depicted embodiment, memory array 100 is a static random access memory (SRAM) array. However, the present disclosure contemplates embodiments, where memory array 100 is another type of memory, such as a dynamic random access memory (DRAM), a non-volatile random access memory (NVRAM), a flash memory, or other suitable memory. Memory array 100 may be included in a microprocessor, a memory, and/or other IC device. In some implementations, memory array 100 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 2 has been simplified for the sake of clarity to better understand the inventive concepts of the present disclosure. Additional features can be added in memory array 100, and some of the features described below can be replaced, modified, or eliminated in other embodiments of memory array 100.

Memory array 100 includes memory cells 101, such as SRAM memory cells, configured to store data. In some implementations, memory cells 101 include various p-type FinFETs and/or n-type FinFETs. Memory cells 101 are arranged in column 1 to column N extending along a first direction (here, in a y-direction) and row 1 to row M extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 101 in true form and complementary form on a column-by-column basis. Row 1 to row M each includes a word line (WL) (not shown) that facilitates access to respective memory cells 101 on a row-by-row basis. Each memory cell 101 is electrically connected to a respective BL, a respective BLB, and a respective WL, which are electrically connected to a controller 103. Controller 103 is configured to generate one or more signals to select at least one WL and at least one bit line pair (here, BL and BLB) to access at least one of memory cells 101 for read operations and/or write operations. Controller 103 includes any circuitry suitable to facilitate read/write operations from/to memory cells 101, including but not limited to, a column decoder circuit, a row decoder circuit, a column selection circuit, a row selection circuit, a read/write circuit (for example, configured to read data from and/or write data to memory cells 101 corresponding to a selected bit line pair (in other words, a selected column)), other suitable circuit, or combinations thereof. In some implementations, the controller 103 includes at least one sense amplifier configured to detect and/or amplify a voltage differential of a selected bit line pair. In some implementations, the sense amplifier is configured to latch or otherwise store data values of the voltage differential.

A perimeter of memory array 100 is configured with dummy cells, such as edge dummy cells and well strap cells, to ensure uniformity in performance of memory cells 101. Dummy cells are configured physically and/or structurally similar to memory cells 101, but do not store data. For example, dummy cells can include p-type wells, n-type wells, fin structures (including one or more fins), gate structures, source/drain features, and/or contact features. Well strap cells generally refer to dummy cells that are configured to electrically couple a voltage to an n-type well of memory cells 101, a p-type well of memory cells 101, or both. In the depicted embodiment, row 1 to row M each begin with an edge dummy cell 105A and end with an edge dummy cell 105B, such that row 1 to row M of memory cells 101 are disposed between edge dummy cells 105A and edge dummy cells 105B. Edge dummy cells 105A and edge dummy cells 105B are arranged in respective columns extending along the first direction (here, the y-direction). In some implementations, the column of edge dummy cells 105A and/or the column of edge dummy cells 105B are substantially parallel to at least one bit line pair (here, BL and BLB) of memory array 100. In some implementations, edge dummy cells 105A and/or edge dummy cells 105B are configured to connect respective memory cells 101 to respective WLs. In some implementations, edge dummy cells 105A and/or edge dummy cells 105B include circuitry for driving WLs. In some implementations, edge dummy cells 105A and/or edge dummy cells 105B are electrically connected to a power supply voltage $V_{DD}$ (for example, a positive power supply voltage) and/or a power supply voltage $V_{SS}$ (for example, an electrical ground).

In furtherance of the depicted embodiment, column 1 to column N each begin with a well strap cell 107A and end with a well strap cell 107B, such that column 1 to column N of memory cells 101 are disposed between well strap cells 107A and well strap cells 107B. Well strap cells 107A and well strap cells 107B are arranged in respective rows extending along the second direction (here, the x-direction). In some implementations, the row of well strap cells 107A and the row of well strap cells 107B are substantially parallel to at least one WL of memory array 100. Well strap cells 107A are disposed between one of edge dummy cells 105A and one of edge dummy cells 105B, and well strap cells 107B are disposed between one of edge dummy cells 105A and one of edge dummy cells 105B. In the depicted embodiment, well strap cells 107A and/or well strap cells 107B include an n-type well strap, a p-type well strap, or both an n-type well strap and a p-type well strap. In some implementations, well strap cells 107A and/or well strap cells 107B include an n-type well strap region having one or more n-type well straps disposed adjacent to a p-type well strap region having one or more p-type well straps. The n-type well strap region and the p-type well strap region may be disposed between dummy regions of the well strap cells 107A and/or the well strap cells 107B. In some implementations, the n-type well strap is configured as n-type well strap 19A described above. For example, an n-type well strap of well strap cells 107A and/or well strap cells 107B is configured to electrically couple an n-type well that corresponds with at least one p-type FinFET of memory cells 101 to a voltage source (for example, $V_{DD}$), where a width of fin(s) of the n-type well strap are greater than a width of fin(s) of the at least one p-type FinFET. In some implementations, the p-type well strap is configured as p-type well strap 19B described above. For example, a p-type well strap of well strap cells 107A and/or well strap cells 107B is configured to electrically couple a p-type well that corresponds with at least one n-type FinFET of memory cells 101 to a voltage source (for example, $V_{SS}$), where a width of fin(s) of the p-type well strap are greater than a width of fin(s) of the at least one n-type FinFET. Increasing widths of fins of the n-type well strap and/or the p-type well strap relative to widths of fins of the at least one p-type FinFET and/or the at least one n-type FinFET can significantly reduce well pickup resistance, improving latch-up performance of memory array 100.

Figure 3:
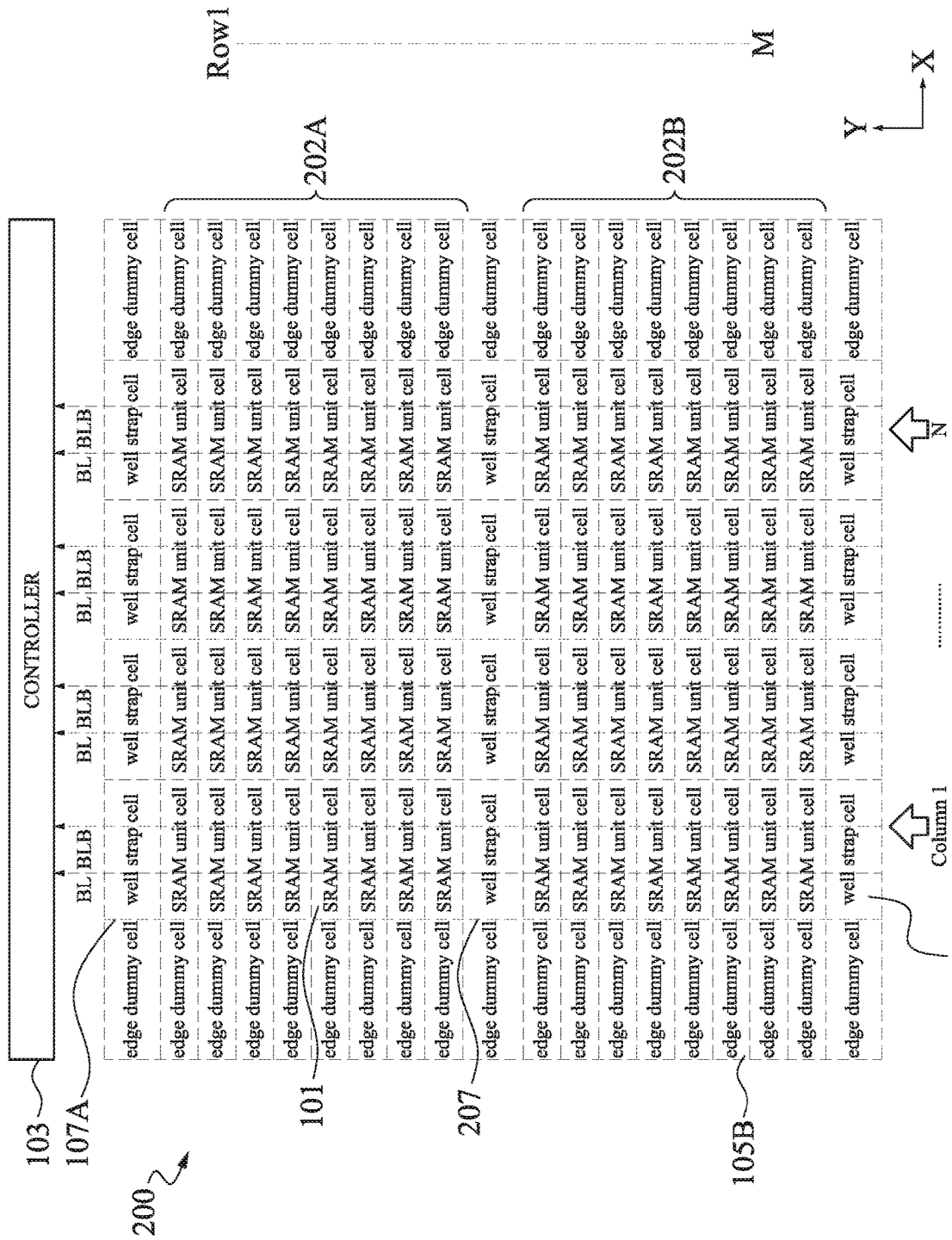
FIG. 3 is a diagrammatic plan view of another memory array, in portion or entirety, according to various aspects of the present disclosure.

FIG. 3 is a diagrammatic plan view of a memory array 200, such as a SRAM array, which can implement well straps configured as described herein, according to various aspects of the present disclosure. Memory array 200 is similar in many respects to memory array 100. Accordingly, similar features in FIG. 3 and FIG. 2 are identified by the same reference numerals for clarity and simplicity. For example, memory array 200 includes memory cells 101, controller 103, edge dummy cells 105A, edge dummy cells 105B, well strap cells 107A, and well strap cells 107B. Memory array 200 may be included in a microprocessor, a memory, and/or other IC device. In some implementations, memory array 200 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 3 has been simplified for the sake of clarity to better understand the inventive concepts of the present disclosure. Additional features can be added in memory array 200, and some of the features described below can be replaced, modified, or eliminated in other embodiments of memory array 200.

In contrast to memory array 100, memory array 200 divides memory cells 101 into a memory array 202A and a memory array 202B (which can be referred to as sub-arrays). Further, the bit line pair spans memory array 202A and memory array 202B continuously, such that each memory cell 101 of memory array 202A and each memory cell 101 of memory array 202B is electrically connected to a respective BL, a respective BLB, and a respective WL, which are electrically connected to controller 103. Memory array 200 further includes a row of well strap cells 207 extending along the second direction (here, the x-direction), where the row of well strap cells 207 is disposed between memory array 202A and memory array 202B. Memory cells 101 in memory array 202A are disposed between well strap cells 107A and well strap cells 207, and memory cells 101 in memory array 202B are disposed between well strap cells 207 and well strap cells 107B. Column 1 to column N of memory cells 101 in memory array 202A thus each begin with one of well strap cells 107A and end with one of well strap cells 207, and column 1 to column N of memory cells 101 in memory array 202B thus each begin with one of well strap cells 207 and end with one of well strap cells 107B. In furtherance of the depicted embodiment, the row of well strap cells 207 is also disposed between one of edge dummy cells 105A and one of edge dummy cells 105B. In some implementations, the row of well strap cells 207 is substantially parallel to at least one WL of memory array 200. Well strap cells 207 are similar to well strap cells 107A and/or well strap cells 107B. For example, well strap cells 207 include an n-type well strap, a p-type well strap, or both an n-type well strap and a p-type well strap. In some implementations, well strap cells 207 include an n-type well strap region having one or more n-type well straps that is adjacent to a p-type well strap region having one or more p-type well straps. The n-type well strap region and the p-type well strap region may be disposed between dummy regions. In some implementations, the n-type well strap is configured as n-type well strap 19A described above. For example, an n-type well strap of well strap cells 207 is configured to electrically couple an n-type well that corresponds with at least one p-type FinFET of memory cells 101 to a voltage source (for example, $V_{DD}$), where a width of fin(s) of the n-type well strap are greater than a width of fin(s) of the at least one p-type FinFET. In some implementations, the p-type well strap is configured as p-type well strap 19B described above. For example, a p-type well strap of well strap cells 207 is configured to electrically couple a p-type well that corresponds with at least one n-type FinFET of memory cells 101 to a voltage source (for example, $V_{SS}$), where a width of fin(s) of the n-type well strap are greater than a width of fin(s) of the at least one n-type FinFET. Increasing widths of fins of the n-type well strap and/or the p-type well strap relative to widths of fins of the at least one p-type FinFET and/or the at least one n-type FinFET can significantly reduce well pickup resistance, improving latch-up performance of memory array 200.

Figure 4:
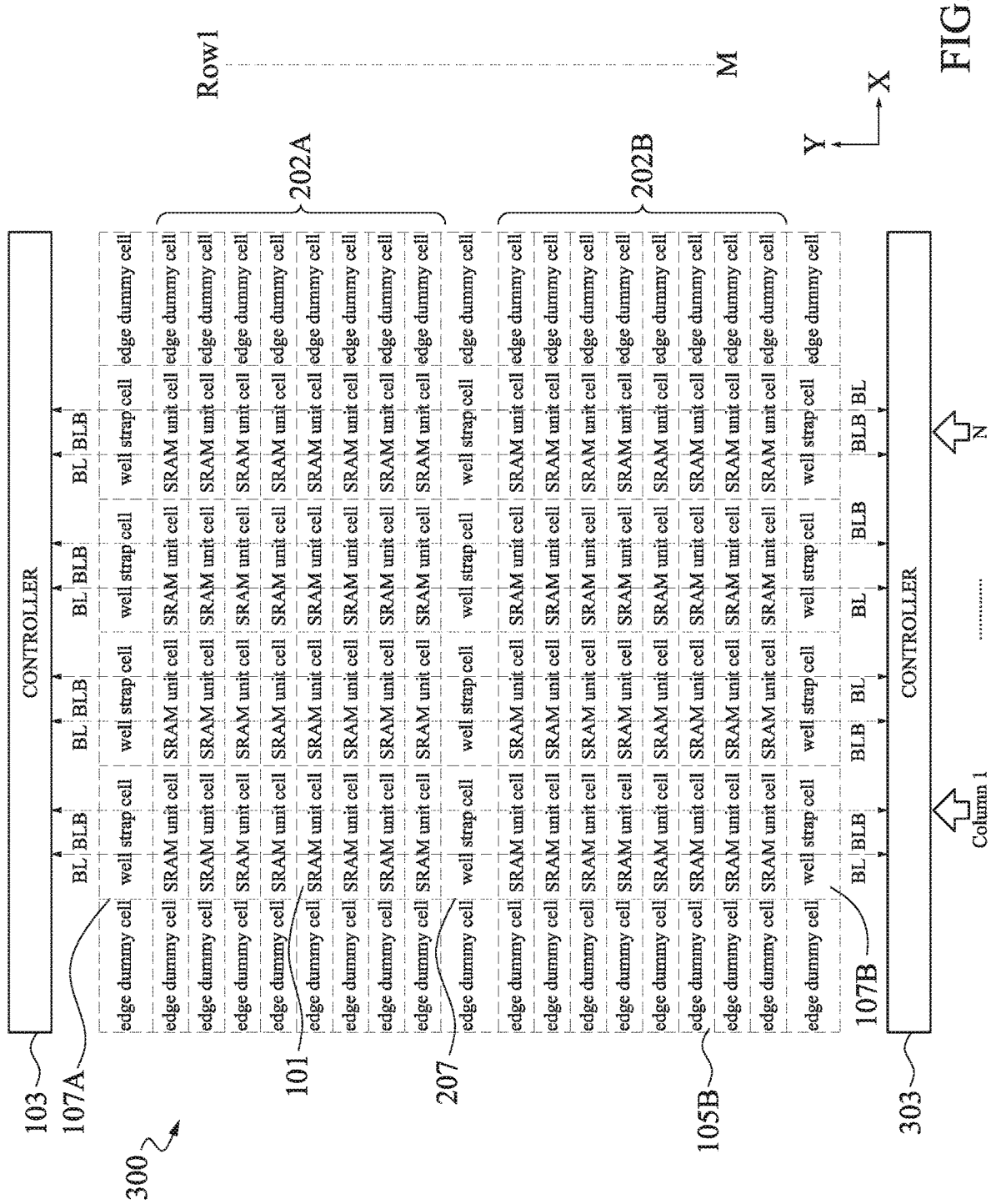
FIG. 4 is a diagrammatic plan view of yet another memory array, in portion or entirety, according to various aspects of the present disclosure.

FIG. 4 is a diagrammatic plan view of a memory array 300, such as a SRAM array, which can implement well straps configured as described herein, according to various aspects of the present disclosure. Memory array 300 is similar in many respects to memory array 200. Accordingly, similar features in FIG. 4 and FIG. 3 are identified by the same reference numerals for clarity and simplicity. For example, memory array 300 includes memory cells 101, controller 103, edge dummy cells 105A, edge dummy cells 105B, well strap cells 107A, well strap cells 107B, and well strap cells 207. In contrast to memory array 200, memory array 300 breaks each bit line pair into a bit line pair for memory array 202A and a bit line pair for memory array 202B, such that column 1 to column N each have two bit line pairs, not a continuous bit line pair. Memory array 300 further includes a controller 203, where BLs, BLBs, and WLs for memory array 202A are electrically connected to controller 103, while BLs, BLBs, and WLs for memory array 202B are electrically connected to controller 203. Controller 203 is similar to controller 103. Accordingly, each memory cell 101 of memory array 202A is electrically connected to a respective BL, a respective BLB, and a respective WL, which are electrically connected to controller 103, and each memory cell 101 in memory array 202B is electrically connected to a respective BL, a respective BLB, and a respective WL, which are electrically connected to controller 203. Memory array 300 may be included in a microprocessor, a memory, and/or other IC device. In some implementations, memory array 300 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 4 has been simplified for the sake of clarity to better understand the inventive concepts of the present disclosure. Additional features can be added in memory array 300, and some of the features described below can be replaced, modified, or eliminated in other embodiments of memory array 300.

Figure 5A:
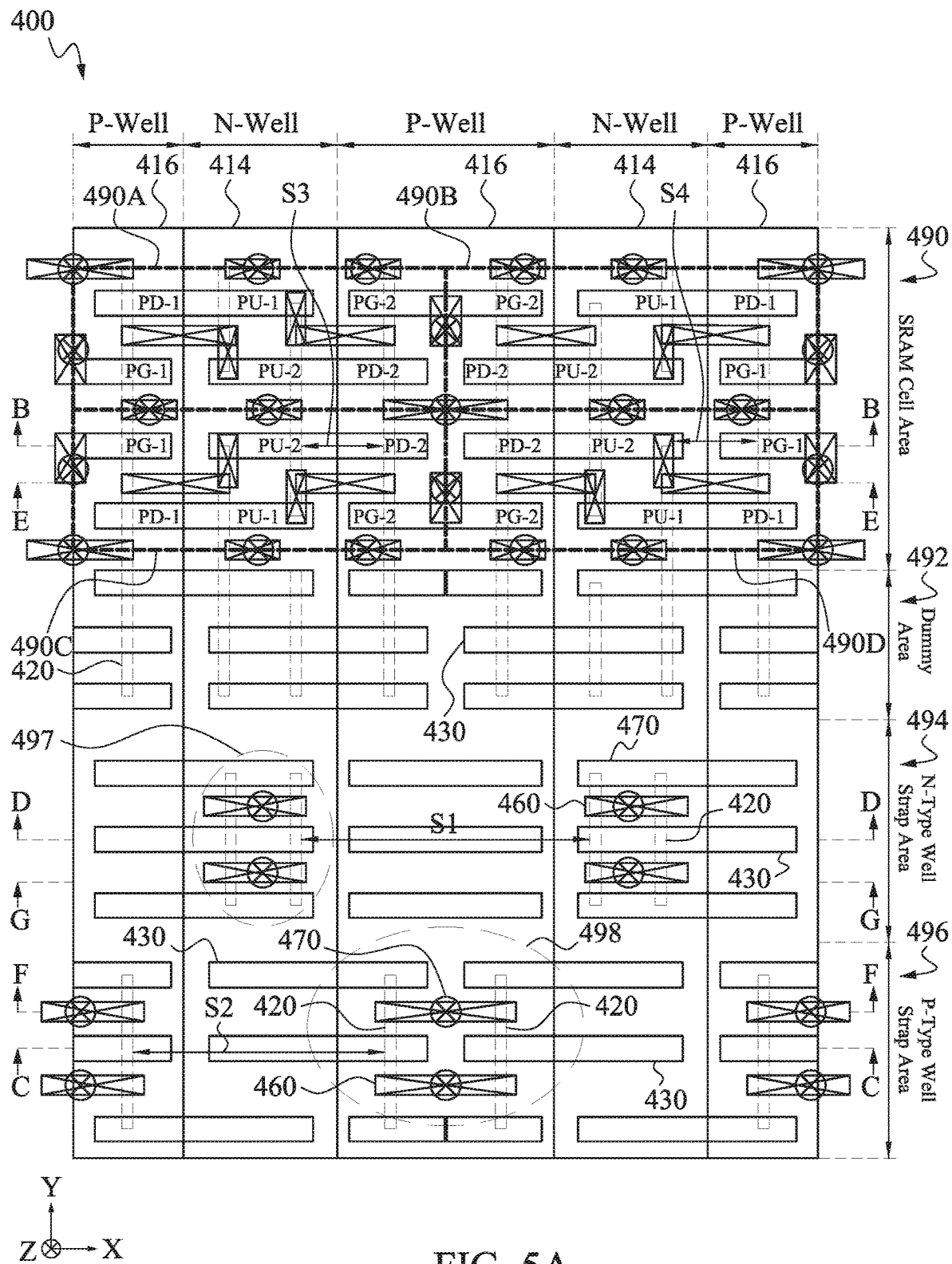
FIGS. 5A-5G are fragmentary diagrammatic views of a memory array, in portion or entirety, according to various aspects of the present disclosure.
Figure 5B:
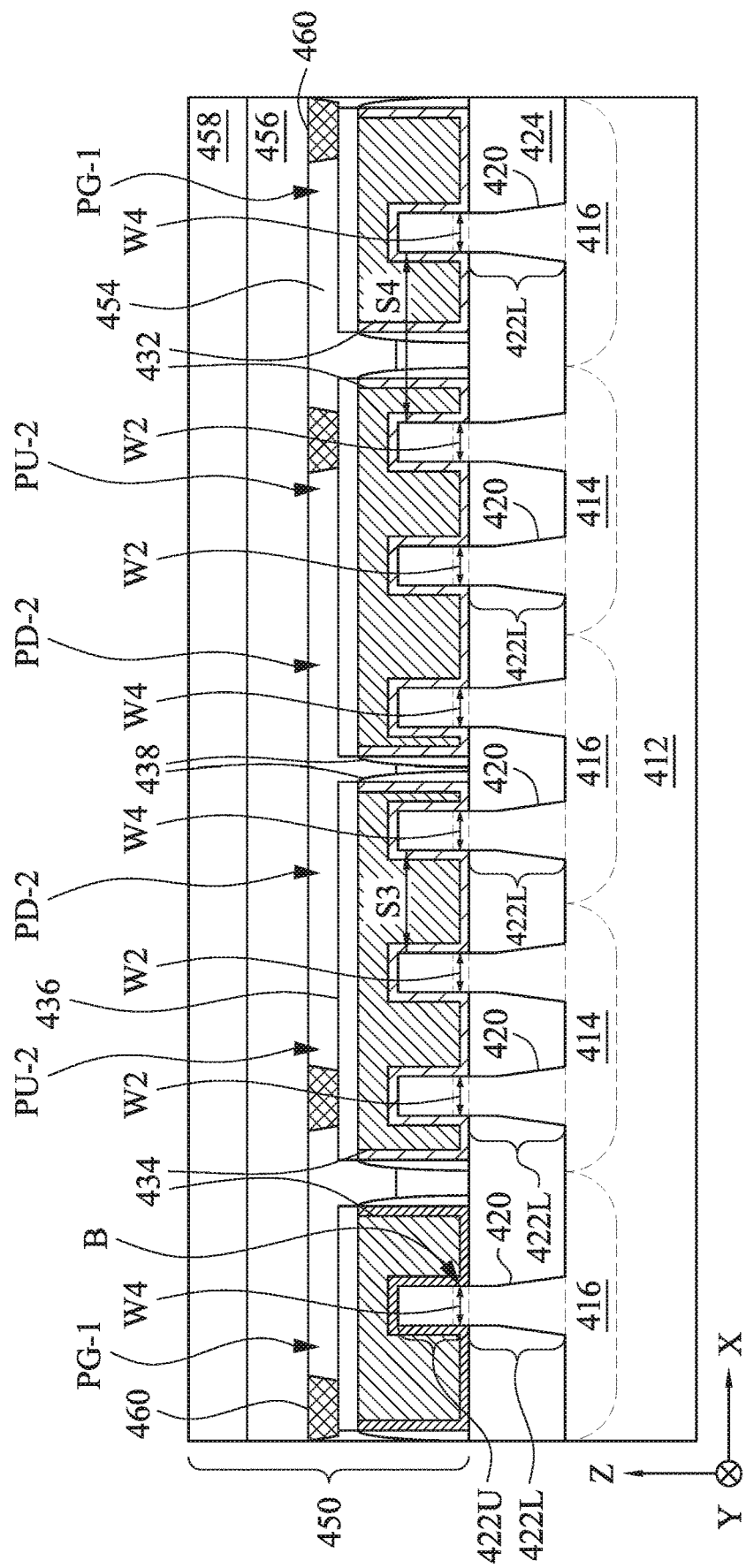
Figure 5C:
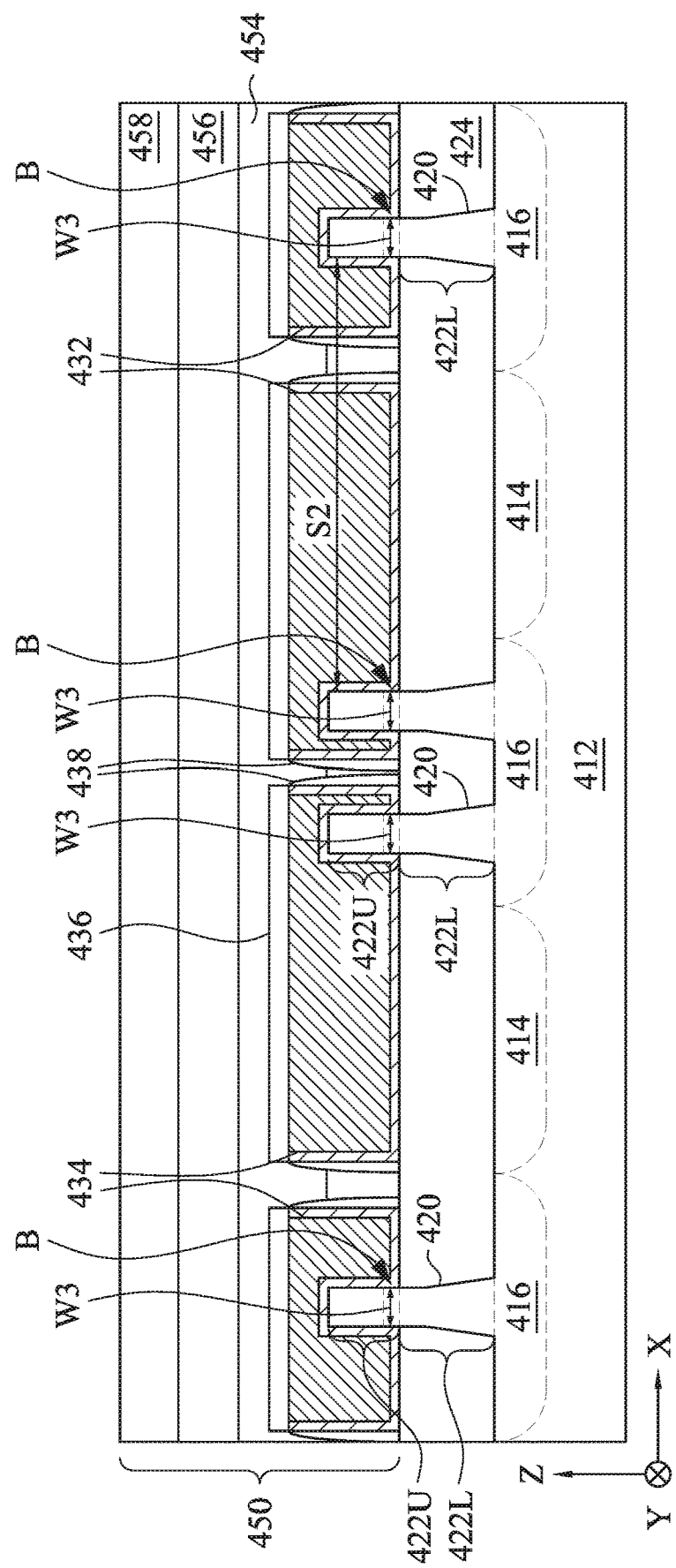
Figure 5D:
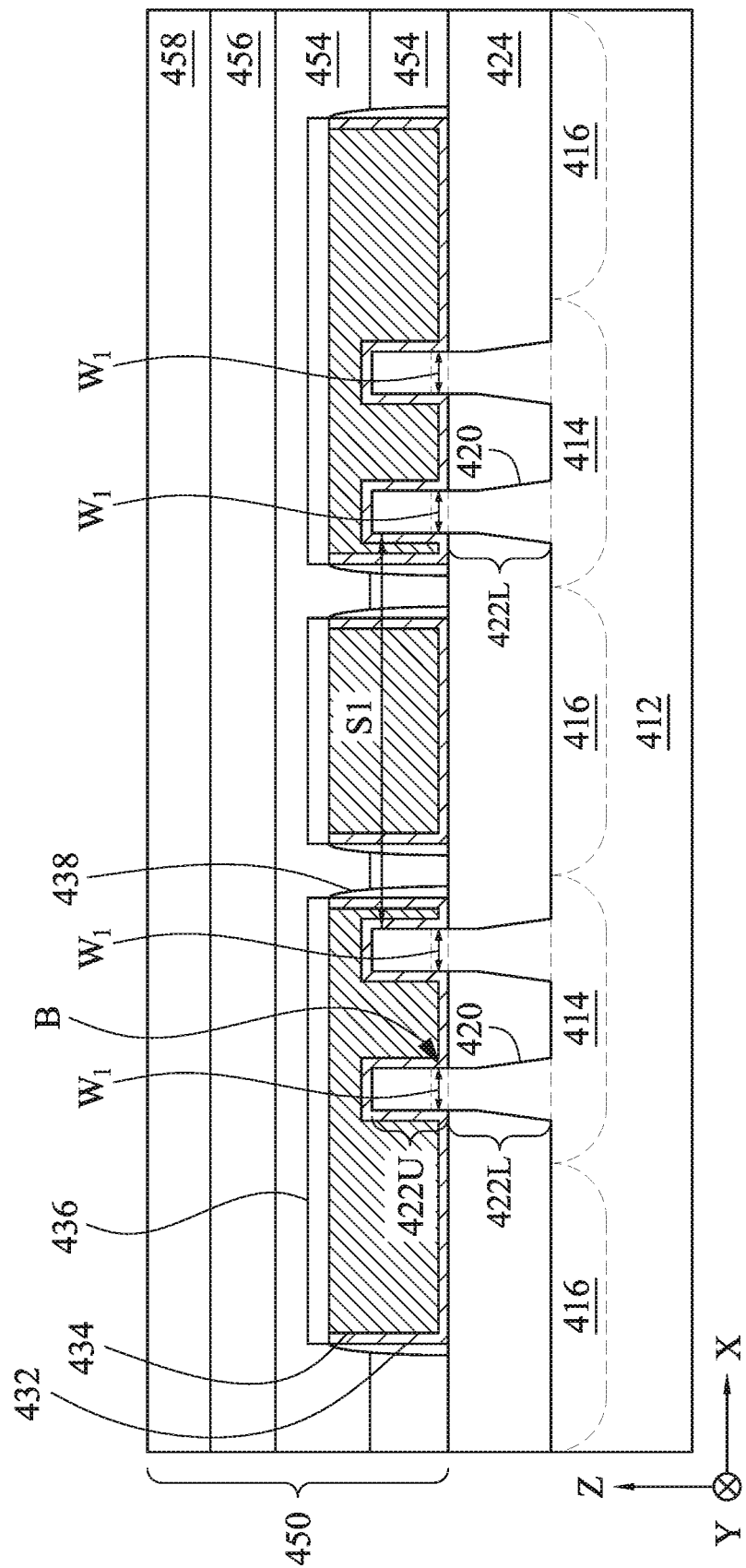
Figure 5E:
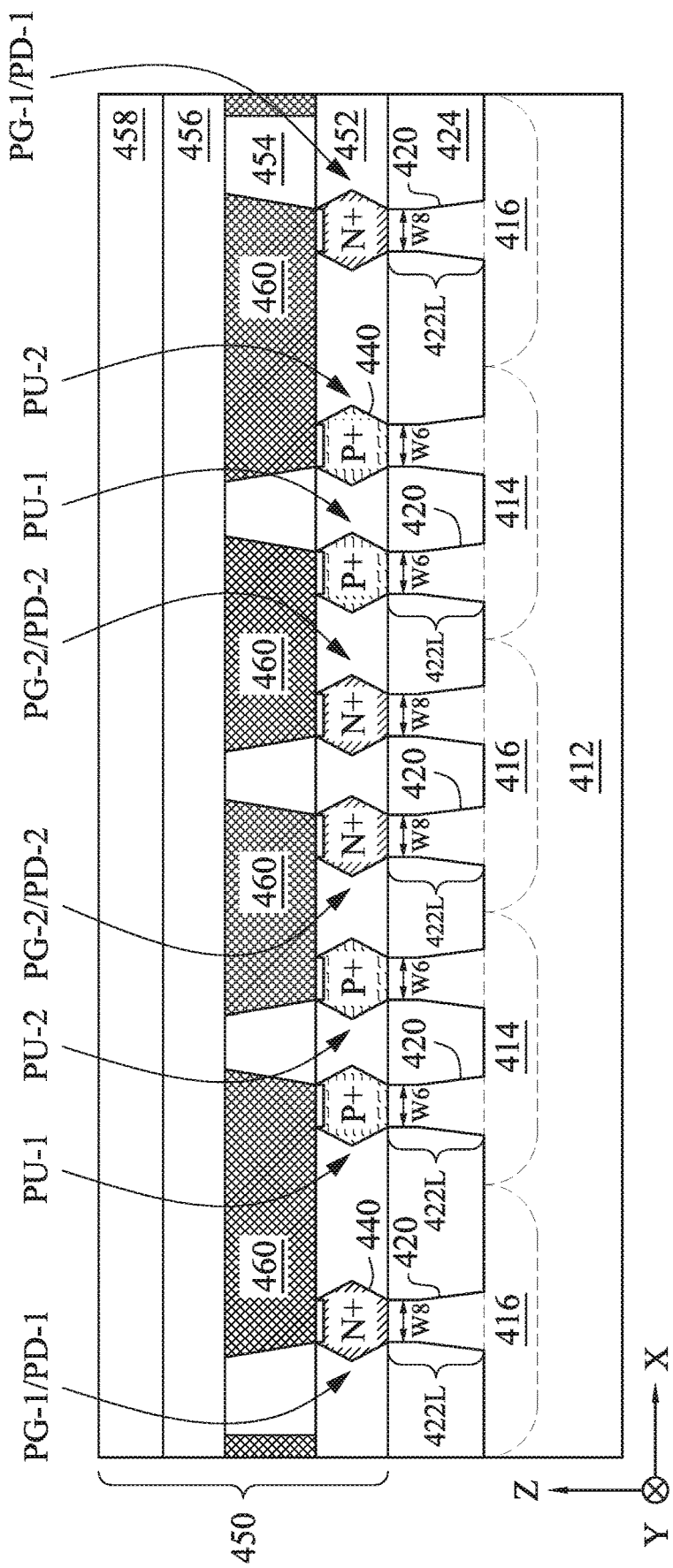
Figure 5F:
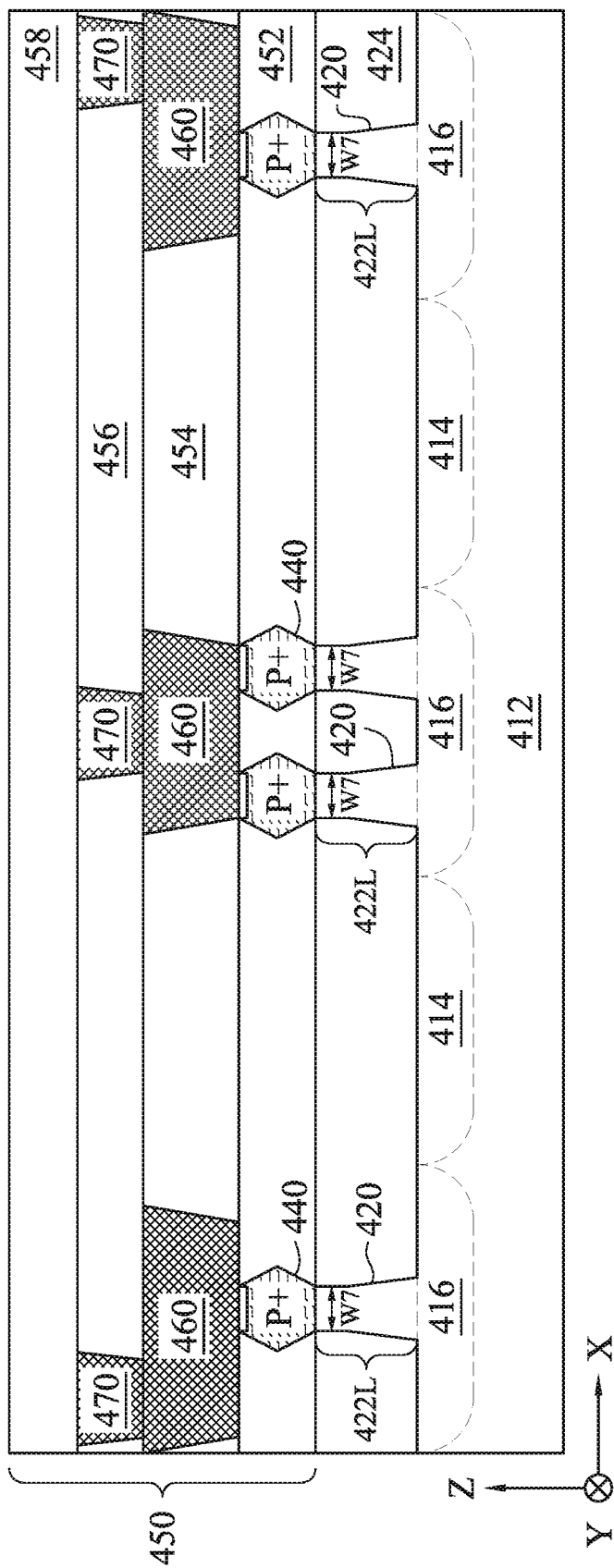
Figure 5G:
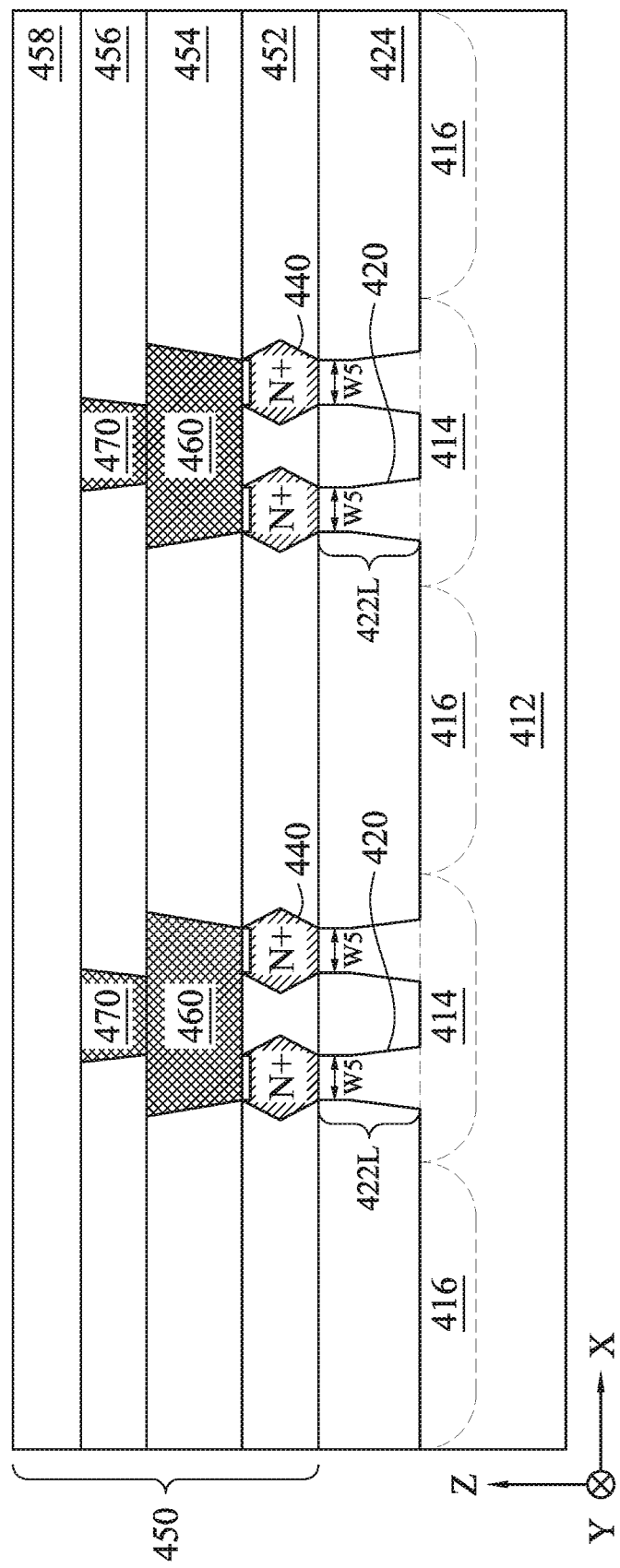

FIGS. 5A-5G are fragmentary diagrammatic views of a SRAM array 400, in portion or entirety, according to various aspects of the present disclosure. In particular, FIG. 5A is a fragmentary top view of SRAM array 400 (for example, in an x-y plane); FIG. 5B is a diagrammatic cross-sectional view of SRAM array 400 along line B-B of FIG. 5A (for example, in an x-z plane); FIG. 5C is a diagrammatic cross-sectional view of SRAM array 400 along line C-C of FIG. 5A (for example, in an x-z plane); FIG. 5D is a diagrammatic cross-sectional view of SRAM array 400 along line D-D of FIG. 5A (for example, in an x-z plane); FIG. 5E is a diagrammatic cross-sectional view of SRAM array 400 along line E-E of FIG. 5A (for example, in an x-z plane); FIG. 5F is a diagrammatic cross-sectional view of SRAM array 400 along line F-F of FIG. 5A (for example, in an x-z plane); and FIG. 5G is a diagrammatic cross-sectional view of SRAM array 400 along line G-G of FIG. 5A (for example, in an x-z plane). In some implementations, SRAM array 400 represents a portion of memory array 100, memory array 200, memory array 300, and/or other suitable memory array. FIGS. 5A-5G have been simplified for the sake of clarity to better understand the inventive concepts of the present disclosure. Additional features can be added in SRAM array 400, and some of the features described below can be replaced, modified, or eliminated in other embodiments of SRAM array 400.

In FIGS. 5A-5G, SRAM array 400 includes a substrate 412 having various doped regions disposed therein, such as n-wells 414 and p-wells 416. Substrate 412, n-wells 414, and p-wells 416 are respectively similar to substrate 12, n-type doped region 14, and p-type doped region 16 described above with reference to FIGS. 1A-1F. SRAM array 400 further includes various features disposed over n-wells 414 and p-wells 416, where the various features are configured to achieve desired functionality. For example, SRAM array 400 includes fins 420 having upper fin active regions 422U and lower fin active regions 422L (similar to fins 20A-20F having upper fin active regions 22U and lower fin active regions 22L described above with reference to FIGS. 1A-1F), isolation feature 424 (similar to isolation feature 24 described above with reference to FIGS. 1A-1F), gate structures 430 (similar to gate structures 30A-30G described above with reference to FIGS. 1A-1F) (including, for example, gate dielectric 432, gate electrode 434, hard mask 436, and/or gate spacers 438 similar to gate dielectric 32, gate electrode 34, hard mask 36, and/or gate spacers 38 as described above with reference to FIGS. 1A-1F), epitaxial source/drain features 440 (similar to epitaxial source/drain features 40A-40D described above with reference to FIGS. 1A-1F), an MLI feature 450 (similar to MLI feature 50 described above with reference to FIGS. 1A-1F), ILD layers 452-458 (similar to ILD layers 52-58 described above with reference to FIGS. 1A-1F), device-level contacts 460 (similar to device-level contacts 60A-60J described above with reference to FIGS. 1A-1F), vias 470 (similar to vias 70A-70I described above with reference to FIGS. 1A-1F), and conductive lines (not shown) (similar to conductive lines 80A-80G described above with reference to FIGS. 1A-1F). In FIG. 5A, the various features are configured to form a SRAM cell area 490, a dummy area 492, an n-type well strap area 494, and a p-type well strap area 496. In the depicted embodiment, dummy area 492 is disposed between SRAM cell area 490 and a well strap area (here, n-type well strap area 494). In furtherance of the depicted embodiment, n-type well strap area 494 is disposed between dummy area 492 and p-type well strap area 496. The present disclosure contemplates different arrangements of SRAM cell area 490, dummy area 492, n-type well strap area 494, and p-type well strap area 496 depending on design requirements of SRAM array 400. In some implementations, memory array 100, memory array 200, and/or memory array 300 (FIGS. 2-4) can implement dummy area 492, n-type well strap area 494, p-type well strap area 496, or combinations thereof in well strap cells 107A, well strap cells 107B, and/or well strap cells 207 depending on design considerations.

SRAM cell area 490 includes a SRAM cell 490A, a SRAM cell 490B, a SRAM cell 490C, and a SRAM cell 490D. SRAM cells 490A-490D include a single port SRAM, a dual-port SRAM, other type SRAM, or combinations thereof. In the depicted embodiment, SRAM cells 490A-490D include single port SRAMs. For example, each of SRAM cells 490A-490D include six transistors: a pass-gate transistor PG-1, a pass-gate transistor PG-2, a pull-up transistor PU-1, a pull-up transistor PU-2, a pull-down transistor PD-1, and a pull-down transistor PD-2. Each of SRAM cells 490A-490D includes one n-type well 414 disposed between two p-type wells 416, where pull-up transistors PU-1, PU-2 are disposed over n-type well 414 and pass-gate transistors PG-1, PG-2 and pull-down transistors PD-1, PD-2 are disposed over p-type wells 416. Pull-up transistors PU-1, PU-2 are p-type FinFETs, pass-gate transistors PG-1, PG-2 are n-type FinFETs, and pull-down transistors PD-1, PD-2 are n-type transistors. In some implementations, pull-up transistors PU-1, PU-2 are configured as p-type FinFET 18A described above with reference to FIGS. 1A-1F, while pass-gate transistors PG-1, PG-2 and pull-down transistors PD-1, PD-2 are configured as n-type FinFET 18B described above with reference to FIGS. 1A-1F. For example, pass-gate transistors PG-1, PG-2 and/or pull-down transistors PD-1, PD-2 each include a fin structure (including one or more fins 420) disposed over a respective p-type well 416 and a respective gate structure 430 disposed over a channel region of the fin structure, such that the respective gate structure 430 interposes source/drain regions of the fin structure. The fin structures of pass-gate transistors PG-1, PG-2 and/or pull-down transistors PD-1, PD-2 include p-type dopants and are electrically connected to p-type wells 416 (FIG. 5B). The fin structures of pass-gate transistors PG-1, PG-2 and/or pull-down transistors PD-1, PD-2 further include n-type epitaxial source/drain features (FIG. 5E) (in other words, epitaxial source/drain features 440 of pass-gate transistors PG-1, PG-2 and/or pull-down transistors PD-1, PD-2 include n-type dopants). Gate structures 430 and/or epitaxial source/drain features 440 of pass-gate transistors PG-1, PG-2 and/or pull-down transistors PD-1, PD-2 are electrically connected to a voltage source (for example, $V_{SS}$) by MLI feature 450 (in particular, respective contacts 460, vias 470, and/or conductive lines disposed in ILD layers 452-458). In furtherance of the example, pull-up transistors PU-1, PU-2 each include a fin structure (including one or more fins 420) disposed over a respective n-type well 414 and a respective gate structure 430 disposed over a channel region of the fin structure, such that the respective gate structure 430 interposes source/drain regions of the fin structure. The fin structures of pull-up transistors PU-1, PU-2 include n-type dopants and are electrically connected to n-type wells 414 (FIG. 5B). The fin structures of pull-up transistors PU-1, PU-2 further include p-type epitaxial source/drain features (FIG. 5E) (in other words, epitaxial source/drain features 440 of pull-up transistors PU-1, PU-2 include p-type dopants). Gate structures 430 and/or epitaxial source/drain features 440 of pull-up transistors PU-1, PU-2 are electrically connected to a voltage source (for example, $V_{DD}$) by MLI feature 450 (in particular, respective contacts 460, vias 470, and/or conductive lines disposed in ILD layers 452-458). In the present example, pull-up transistors PU-1, PU-2, pass-gate transistors PG-1, PG-2, and pull-down transistors PD-1, PD-2 are single fin FinFETs (in other words, the fin structures include one fin), though the present disclosure contemplates implementations where one or more of pull-up transistors PU-1, PU-2, pass-gate transistors PG-1, PG-2, and pull-down transistors PD-1, PD-2 are multi-fin FinFETS (in other words, the fin structures includes multiple fins).

N-type well strap area 494 includes fin-based n-type well strap structures 497 configured to electrically connect respective n-type wells 414 to a voltage source (for example, $V_{DD}$). N-type well strap structures 497 are structurally similar to pull-up transistors PU-1, PU-2. For example, each n-type well strap structure 497 includes a fin structure (including one or more fins 420) disposed over a respective n-type well 414 and a respective gate structure 430 disposed over a channel region of the fin structure, such that the gate structure 430 interposes source/drain regions of the fin structure. In the depicted embodiment, fin width of fins of n-type well strap structures 497 is greater than fin width of fins of pull-up transistors PU-1, PU-2, which reduces well pickup resistance and latch-up in SRAM array 400. For example, a width $w_1$ in channel regions of fins 420 of n-type well strap structures 497 (FIG. 5D) is greater than a width $w_2$ in channel regions of fins 420 of pull-up transistors PU-1, PU-2 (FIG. 5B). In some implementations, a ratio of width $w_1$ to width $w_2$ is greater than 1.1. In some implementations, a ratio of width $w_1$ to width $w_2$ is $1.1<w_1/w_2<1.5$. In some implementations, widths $w_1$, $w_2$ are average widths for bottom portions B of upper fin active regions 422U, such as a bottommost 5 nm of upper fin active regions 422U. In some implementations, tapering of upper fin active regions 422U, lower fin active regions 422L, and/or an entirety of fins of n-type well strap structures 497 is greater than tapering of upper fin active regions 422U, lower fin active regions 422L, and/or an entirety of fins of pull-up transistors PU-1, PU-2. For example, a slope of sidewalls of upper fin active region 422U of fins of n-type well strap structures 497 is greater than a slope of sidewalls of upper fin active region 422U of fins of pull-up transistors PU-1, PU-2. The fin structures of the n-type well strap structures 497 include n-type dopants and are electrically connected to respective n-type wells 414 (FIGS. 5D, 5G). In some implementations, a dopant concentration of the fins of n-type well strap structures 497 is greater than a dopant concentration of the fins of pull-up transistors PU-1, PU-2. In some implementations, the dopant concentration of the fins of n-type well strap structures 497 is at least three times greater than a dopant concentration of the fins of pull-up transistors PU-1, PU-2. Increasing the dopant concentration of the fins of n-type well strap structures 497 can further reduce well pickup resistance and latch-up in SRAM array 400. Further, in contrast to the fin structures of pull-up transistors PU-1, PU-2, the fin structures of n-type well strap structures 497 further include n-type epitaxial source/drain features (FIG. 5G) (in other words, epitaxial source/drain features 440 of n-type well strap structures 497 include n-type dopants), which are electrically connected to the voltage source by MLI feature 450 (in particular, respective contacts 460, vias 470, and/or conductive lines disposed in ILD layers 452-458).

P-type well strap area 496 includes fin-based p-type well strap structures 498 configured to electrically connect p-type wells 416 to a voltage source (for example, $V_{SS}$). P-type well strap structures 498 are structurally similar to pull-down transistors PD-1, PD-2 and/or pass-gate transistors PG-1, PG-2. For example, each p-type well strap structure 498 includes a fin structure (including one or more fins 420) disposed over a respective p-type well 416 and a respective gate structure 430 disposed over a channel region of the fin structure, such that the gate structure 430 interposes source/drain regions of the fin structure. In the depicted embodiment, fin width of fins of p-type well strap structures 498 is greater than fin width of fins of pull-down transistors PD-1, PD-2 and/or pass-gate transistors PG-1, PG-2, which reduces well pickup resistance and latch-up in SRAM array 400. For example, a width $w_3$ in channel regions of fins 420 of p-type well strap structures 498 (FIG. 5C) is greater than a width $w_4$ in channel regions of fins 420 of pull-down transistors PD-1, PD-2 and/or pass-gate transistors PG-1, PG-2 (FIG. 5B). In some implementations, a ratio of width $w_3$ to width $w_4$ is greater than 1.1. In some implementations, a ratio of width $w_3$ to width $w_4$ is $1.1<w_3/w_4<1.5$. In some implementations, widths $w_3$, $w_4$ are average widths for bottom portions B of upper fin active regions 422U, such as a bottommost 5 nm of upper fin active regions 422U. In some implementations, tapering of upper fin active regions 422U, lower fin active regions 422L, and/or an entirety of fins of p-type well strap structures 498 is greater than tapering of upper fin active regions 422U, lower fin active regions 422L, and/or an entirety of fins of pull-down transistors PD-1, PD-2 and/or pass-gate transistors PG-1, PG-2. For example, a slope of sidewalls of upper fin active region 422U of fins of p-type well strap structures 498 is greater than a slope of sidewalls of upper fin active region 422U of fins of pull-down transistors PD-1, PD-2 and/or pass-gate transistors PG-1, PG-2. The fin structures of the p-type well strap structures 498 include p-type dopants and are electrically connected to respective p-type wells 416 (FIGS. 5C, 5F). In some implementations, a dopant concentration of the fins of p-type well strap structures 498 is greater than a dopant concentration of the fins of pull-down transistors PD-1, PD-2 and/or pass-gate transistors PG-1, PG-2. In some implementations, the dopant concentration of the fins of p-type well strap structures 498 is at least three times greater than a dopant concentration of the fins of pull-down transistors PD-1, PD-2 and/or pass-gate transistors PG-1, PG-2. Increasing the dopant concentration of the fins of p-type well strap structures 498 can further reduce pick-up resistance and latch-up in SRAM array 400. Further, in contrast to the fin structures of pull-down transistors PD-1, PD-2 and/or pass-gate transistors PG-1, PG-2, the fin structures of p-type well strap structures 498 further include p-type epitaxial source/drain features (FIG. 5F) (in other words, epitaxial source/drain features 440 of p-type well strap structures 498 include p-type dopants), which are electrically connected to the voltage source by MLI feature 450 (in particular, respective contacts 460, vias 470, and/or conductive lines disposed in ILD layers 452-458).

In some implementations, a width in source/drain regions of fins 420 of n-type well strap structures 497 and/or p-type well strap structures 498 is greater than a width in source/drain regions of fins 420 respectively of pull-up transistors PU-1, PU-2 and pull-down transistors PD-1, PD-2/pass-gate transistors PG-1, PG-2. For example, a width $w_5$ in source/drain regions of fins 420 of n-type well strap structures 497 (FIG. 5G) is greater than a width $w_6$ in source/drain regions of fins 420 of pull-up transistors PU-1, PU-2 (FIG. 5E). In some implementations, a ratio of width $w_5$ to width $w_6$ is greater than 1.1. In some implementations, a ratio of width $w_5$ to width $w_6$ is $1.1 < w_5/w_6 < 1.5$. In some implementations, widths $w_5$, $w_6$ represent widths of fins 420 at an interface between fins 420 and epitaxial source/drain features 440. In some implementations, widths $w_5$, $w_6$ are average widths for top portions of fins 420 interfacing with epitaxial source/drain features 440 (here, top portions of lower fin active regions 422L), such as a topmost 5 nm of the top portions of fins 420. In furtherance of the example, a width $w_7$ in source/drain regions of fins 420 of p-type well strap structures 498 (FIG. 5F) is greater than a width $w_8$ in source/drain regions of fins 420 of pull-down transistors PD-1, PD-2 and/or pass-gate transistors PG-1, PG-2 (FIG. 5E). In some implementations, a ratio of width $w_7$ to width $w_8$ is greater than 1.1. In some implementations, a ratio of width $w_7$ to width $w_8$ is $1.1 < w_7/w_8 < 1.5$. In some implementations, widths $w_7$, $w_8$ represent widths of fins 420 at an interface between fins 420 and epitaxial source/drain features 440. In some implementations, widths $w_7$, $w_8$ are average widths for top portions of fins 420 interfacing with epitaxial source/drain features 440 (here, top portions of lower fin active regions 422L), such as a topmost 5 nm of the top portions of fins 420. In some implementations, well strap fins have substantially the same width in the channel regions (for example, $w_1 \approx w_3$) and/or the source/drain regions (for example, $w_5 \approx w_7$), and FinFET fins have substantially the same width in the channel regions (for example, $w_2 \approx w_4$) and/or in the source/drain regions (for example, $w_6 \approx w_8$).

In some implementations, to achieve the varying fin widths in the FinFETs and the well straps without significantly modifying fabrication of the FinFETs and the well straps, fins of p-type FinFETs are disposed adjacent to fins of n-type FinFETs, whereas fins of n-type well straps are not disposed adjacent to fins of p-type well straps. For example, in SRAM array 400, fins 420 of n-type well strap structures 497 are not disposed adjacent to fins 420 of p-type well strap structures 498 along the fin width direction, such that oppositely doped fins of the well straps are not disposed adjacent to one another along the fin width direction. In some implementations, no fins for p-type well straps are disposed in n-type well strap area 494 and no fins for n-type well straps are disposed in p-type well strap area 496, such that n-type well strap structures 497 are disposed adjacent to p-well regions 416 that are free of p-type doped fins along the fin width direction of the n-type doped fins of n-type well strap structures 497 and p-type well strap structures 498 are disposed adjacent to n-well regions 414 that are free of n-type doped fins along the fin width direction of the p-type doped fins of p-type well strap structures 498. In some implementations, a spacing S1 between fins 420 of adjacent n-type well strap structures 497 along the fin width direction is about 80 nm to about 250 nm, and a spacing S2 between fins 420 of adjacent p-type well strap structures 498 along the fin width direction is about 80 nm to about 250 nm. In furtherance of the example, in SRAM array 400, fins 420 of pull-up transistors PU-1, PU-2 are disposed adjacent to fins 420 of pull-down transistors PD-1, PD-2 and pass-gate transistors PG-1, PG-2 along the fin width direction, such that oppositely doped fins of the FinFETs are disposed adjacent to one another along the fin width direction. In some implementations, pull-up transistors PU-1, PU-2 are disposed adjacent to p-well regions 416 that have p-type doped fins disposed thereover along the fin width direction of the n-type doped fins of pull-up transistors PU-1, PU-2; pull-down transistors PD-1, PD-2 are disposed adjacent to n-well regions 414 that have n-type doped fins disposed thereover along the fin width direction of the p-type doped fins of the pull-down transistors PD-1, PD-2; and pass-gate transistors PG-1, PG-2 are disposed adjacent to n-well regions 414 that have n-type doped fins disposed thereover along the fin width direction of the p-type doped fins of the pass-gate transistors PG-1, PG-2. In some implementations, a spacing S3 between fins 420 of adjacent pull-up transistors PU-1, PU-2 and pull-down transistors PD-1, PD-2 along the fin width direction is about 30 nm to about 70 nm, and a spacing S4 between fins 420 of adjacent pull-up transistors PU-1, PU-2 and pass-gate transistors PG-1, PG-2 along the fin width direction is about 30 nm to about 70 nm. By spacing well strap fins and FinFET fins as described, FinFETs have dense fin environments with narrower spacing between fins and well straps have isolated fin environments with wider spacing between fins, such that etch loading effects can be used to reduce widths of the FinFET fins (here, for pull-up transistors PU-1, PU-2, pull-down transistors PD-1, PD-2, and/or pass-gate transistors PG-1, PG-2) relative to well strap fins (here, for n-type well strap structure 497 and/or p-type well strap structures 498). A patterning layer to be used as a mask during an etching process for forming the FinFET fins and the well strap fins can thus include FinFET fin patterns and well strap fin patterns having substantially the same fin width, where etch loading effects from the etching process (arising from the different fin density environments) narrow the width of the FinFET fins relative to the well strap fins, seamlessly integrating the advantages described herein into FinFET fabrication without increasing complexity, cost, and/or time.

Figure 6:
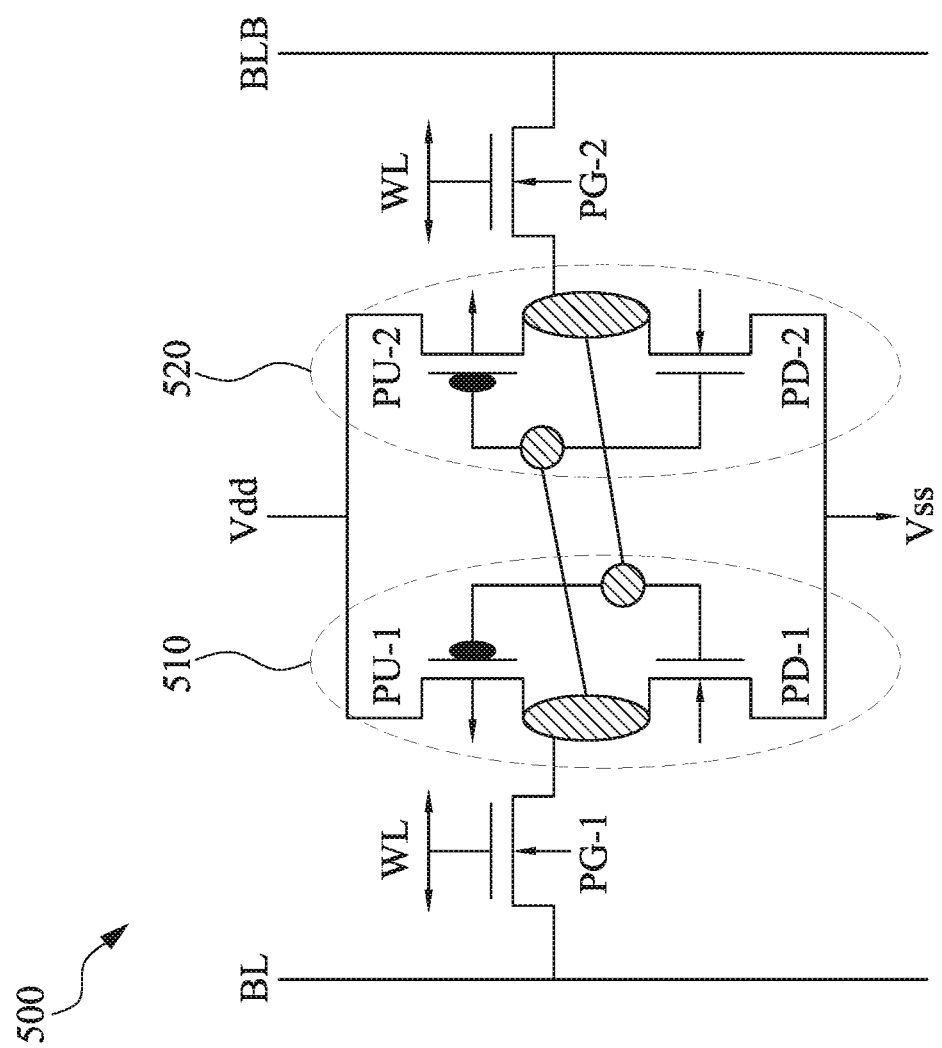
FIG. 6 is a circuit diagram of a single-port SRAM cell, which can be implemented in a memory cell of a SRAM array, according to various aspects of the present disclosure.

FIG. 6 is a circuit diagram of a single-port SRAM cell 500, which can be implemented in a memory cell of a SRAM array, according to various aspects of the present disclosure. In some implementations, single-port SRAM cell 500 is implemented in one or more memory cells 101 of memory array 100 (FIG. 2), memory array 200 (FIG. 3), and/or memory array 300 (FIG. 4). In some implementations single-port SRAM cell 500 is implemented in one or more of SRAM cells of SRAM array 400 (FIGS. 5A-5G), such as one or more of SRAM cells 490A-490D. FIG. 6 has been simplified for the sake of clarity to better understand the inventive concepts of the present disclosure. Additional features can be added in single-port SRAM cell 500, and some of the features described below can be replaced, modified, or eliminated in other embodiments of single-port SRAM cell 500.

Single-port SRAM cell 500 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Single-port SRAM cell 500 is thus alternatively referred to as a 6T SRAM cell. In operation, pass-gate transistor PG-1 and pass-gate transistor PG-2 provide access to a storage portion of SRAM cell 500, which includes a cross-coupled pair of inverters, an inverter 510 and an inverter 520. Inverter 510 includes pull-up transistor PU-1 and pull-down transistor PD-1, and inverter 520 includes pull-up transistor PU-2 and pull-down transistor PD-2. In some implementations, pull-up transistors PU-1, PU-2 are configured as p-type FinFETs, such as p-type FinFET 18A (FIGS. 1A-1F), and pull-down transistors PD-1, PD-2 are configured as n-type FinFETs, such as n-type FinFET 18B described above (FIGS. 1A-1F). For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well region; and pull-down transistors PD-1, PD-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region. In some implementations, pass-gate transistors PG-1, PG-2 are also configured as n-type FinFETs, such as n-type FinFET 18B described above (FIGS. 1A-1F). For example, pass-gate transistors PG-1, PG-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region.

A gate of pull-up transistor PU-1 interposes a source (electrically coupled with a power supply voltage ($V_{DD}$)) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

Figure 7:
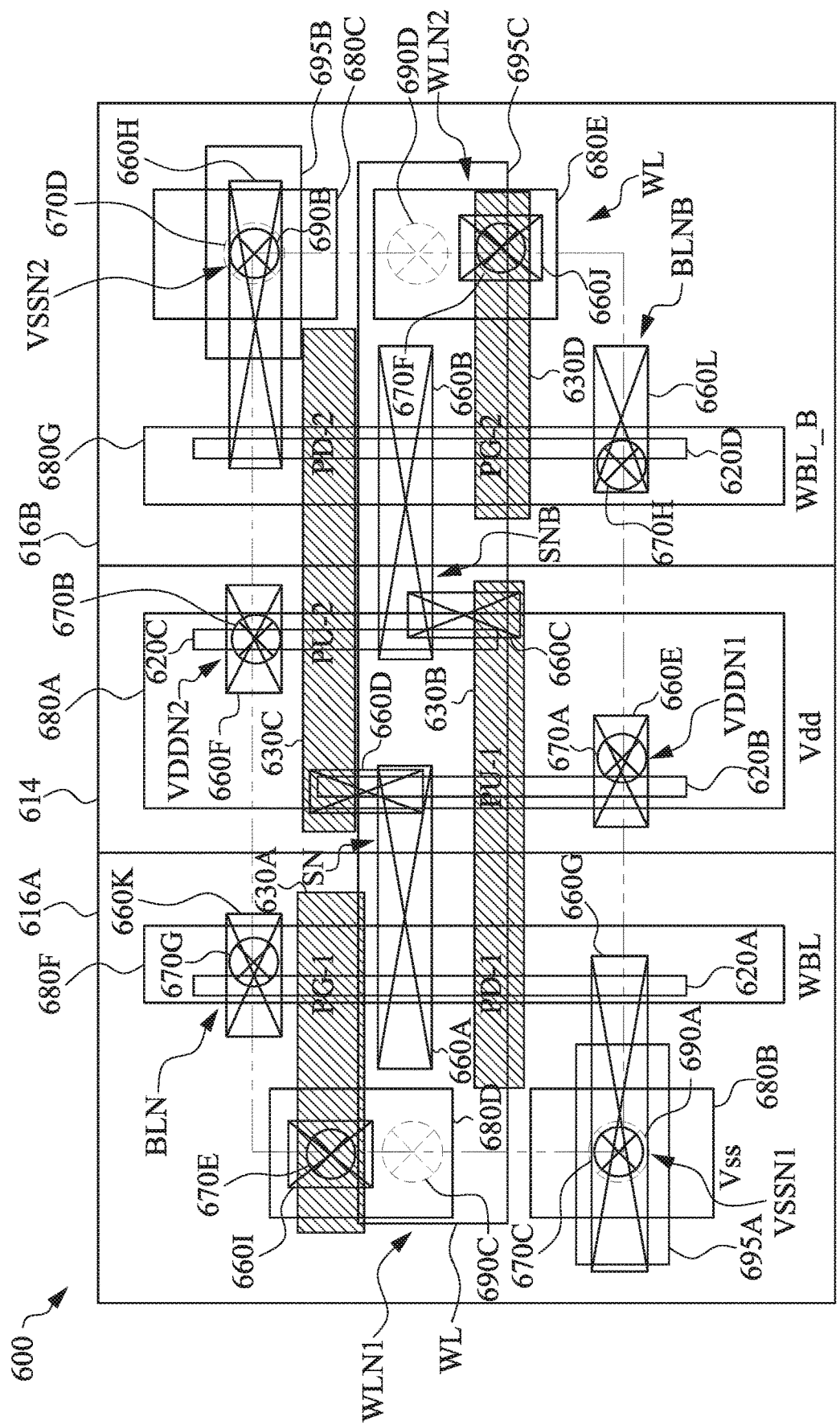
FIG. 7 is a plan view of a single-port SRAM cell, which can be implemented in a memory cell of a memory array, according to various aspects of the present disclosure.

FIG. 7 is a plan view of a single-port SRAM cell 600, which can be implemented in a memory cell of a SRAM array, according to various aspects of the present disclosure. In some implementations, single-port SRAM cell 600 is implemented in one or more memory cells 101 of memory array 100 (FIG. 2), memory array 200 (FIG. 3), and/or memory array 300 (FIG. 4). In some implementations single-port SRAM cell 500 is implemented in one or more of SRAM cells of SRAM array 400 (FIGS. 5A-5G), such as one or more of SRAM cells 490A-490D. FIG. 7 has been simplified for the sake of clarity to better understand the inventive concepts of the present disclosure. Additional features can be added in single-port SRAM cell 600, and some of the features described below can be replaced, modified, or eliminated in other embodiments of single-port SRAM cell 600.

Single-port SRAM cell 600 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Single-port SRAM cell 600 is thus alternatively referred to as a 6T SRAM cell. Single-port SRAM cell 600 includes an n-well 614 (similar to n-type doped region 14 described above with reference to FIGS. 1A-1F) disposed between a p-well 616A and a p-well 616B (both similar to p-type doped region 16 described above with reference to FIGS. 1A-1F). Pull-up transistors PU-1, PU-2 are disposed over n-well 614; pull-down transistor PD-1 and pass-gate transistor PG-1 are disposed over p-well 616A; and pull-down transistor PD-2 and pass-gate transistor PG-2 are disposed over p-well 616B. In some implementations, pull-up transistors PU-1, PU-2 are configured as p-type FinFETs, such as p-type FinFET 18A (FIGS. 1A-1F), and pull-down transistors PD-1, PD-2 and pass-gate transistors PG-1, PG-2 are configured as n-type FinFETs, such as n-type FinFET 18B described above (FIGS. 1A-1F). In the depicted embodiment, pull-down transistor PD-1 and pass-gate transistor PG-1 are single fin FinFETs including a fin 620A, pull-up transistor PU-1 is a single fin FinFET including a fin 620B, pull-up transistor PU-2 is a single fin FinFET including a fin 620C, and pull-down transistor PD-2 and pass-gate transistor PG-2 are single fin FinFETs including a fin 620D. Fins 620A-620D are similar to fins 20A-20F described above with reference to FIGS. 1A-1F. For example, fin 620A and fin 620D are p-type doped fins, and fin 620B and fin 620C are n-type doped fins. A gate structure 630A is disposed over fin 620A; a gate structure 630B is disposed over fins 620A, 620B; a gate structure 630C is disposed over fins 620C, 620D; and a gate structure 630D is disposed over fin 620D. A gate of pass-gate transistor PG-1 is formed from gate structure 630A, a gate of pull-down transistor PD-1 is formed from gate structure 630B, a gate of pull-up transistor PU-1 is formed from gate structure 630B, a gate of pull-up transistor PU-2 is formed from gate structure 630C, a gate of pull-down transistor PD-2 is formed from gate structure 630C, and a gate of pass-gate transistor PG-2 is formed from gate structure 630D. Gate structures 630A-630D are similar to gate structures 30A-30G described above with reference to FIGS. 1A-1F.

Single-port SRAM cell 600 further includes an MLI feature that includes various device-level contacts 660A-660L, vias 670A-670H, conductive lines 680A-680G, vias 690A-690D, and conductive lines 695A-695C. Device-level contacts 660A-660L, vias 670A-670H, conductive lines 680A-680G are respectively similar to device-level contacts 60A-60J, vias 70A-70I, and conductive lines 80A-80G described above with reference to FIGS. 1A-1F. In some implementations, vias 690A-690D are similar to vias 70A-70I described above with reference to FIGS. 1A-1F, except vias 690A-690D electrically connect a metal one (M1) layer of the MLI feature (here, conductive lines 680A-680G) to a metal two (M2) layer of the MLI feature (here, conductive lines 695A-695C). In some implementations, conductive lines 695A-695C are similar to conductive lines 80A-80G described above with reference to FIGS. 1A-1F, except conductive lines 695A-695C form a different metal layer in the MLI feature than conductive lines 680A-680G. In the depicted embodiment, conductive lines 695A-695C extend in a direction substantially orthogonal to conductive lines 680A-680G. The present disclosure contemplates different configurations of device-level contacts 660A-660L, vias 670A-670H, conductive lines 680A-680G, vias 690A-690D, and/or conductive lines 695A-695C depending on design requirements of single-port SRAM cell 600.

A drain region of pull-down transistor PD-1 (formed by fin 620A (which can include n-type epitaxial source/drain features)) and a drain region of pull-up transistor PU-1 (formed by fin 620B (which can include p-type epitaxial source/drain features)) are electrically connected by device-level contact 660A, such that a common drain of pull-down transistor PD-1 and pull-up transistor PU-1 form a storage node SN, which is further electrically connected to a drain region of pass-gate transistor PG-1 (formed by fin 620A (which can include n-type epitaxial source/drain features)) by device-level contact 660A. A drain region of pull-down transistor PD-2 (formed by fin 620D (which can include n-type epitaxial source/drain features)) and a drain region of pull-up transistor PU-2 (formed by fin 620C (which can include p-type epitaxial source/drain features)) are electrically connected by device-level contact 660B, such that a common drain of pull-down transistor PD-2 and pull-up transistor PU-2 form a storage node SNB, which is further electrically connected to a drain region of pass-gate transistor PG-2 (formed by fin 620D (which can include n-type epitaxial source/drain features)) by device-level contact 660B. Device-level contact 660C electrically connects a gate of pull-up transistor PU-1 (formed by gate structure 630B) and a gate of pull-down transistor PD-1 (also formed by gate structure 630B) to storage node SNB. Device-level contact 660D electrically connects a gate of pull-up transistor PU-2 (formed by gate structure 630C) and a gate of pull-down transistor PD-2 (also formed by gate structure 630C) to storage node SN. A source region of pull-up transistor PU-1 (formed by fin 620B (which can include p-type epitaxial source/drain features)) is electrically connected to a power supply voltage $V_{DD}$ at a voltage node VDDN1 by device-level contact 660E, via 670A, and conductive line 680A; and a source region of pull-up transistor PU-2 (formed by fin 620C (which can include p-type epitaxial source/drain features)) to power supply voltage $V_{DD}$ at a voltage node VDDN2 by device-level contact 660F, via 670B, and conductive line 680A. A source region of pull-down transistor PD-1 (formed by fin 620A (which can include n-type epitaxial source/drain features)) to a power supply voltage $V_{SS}$ at a voltage node VSSN1 by device-level contact 660G, via 670C, conductive line 680B, via 690A, and conductive line 695A; and a source region of pull-down transistor PD-2 (formed by fin 620D (which can include n-type epitaxial source/drain features)) to power supply voltage $V_{SS}$ at a voltage node VSSN2 by device-level contact 660H, via 670D, conductive line 680C, via 690B, and conductive line 695B. A gate of pass-gate transistor PG-1 (formed by gate structure 630A) is electrically connected to a word line WL at a word line node WLN1 by device-level contact 660I, via 670E, conductive line 680D, and via 690C; and a gate of pass-gate transistor PG-2 (formed by gate structure 630D) is electrically connected to the word line WL at a word line node WLN2 by device-level contact 660J, via 670F, conductive line 680E, via 690D, and conductive line 695C. A source region of pass-gate transistor PG-1 (formed by fin 620A (which can include n-type epitaxial source/drain features)) is electrically connected to a bit line (generally referred to as a bit line node BLN) by a device-level contact 660K, a via 670G, and a conductive line 680F; and a source region of pass-gate transistor PG-2 (formed by fin 620D (which can include n-type epitaxial source/drain features)) is electrically connected to a complementary bit line (generally referred to as a bit line node BLNB) by a device-level contact 660L, a via 670H, and a conductive line 680G.

Figure 8:
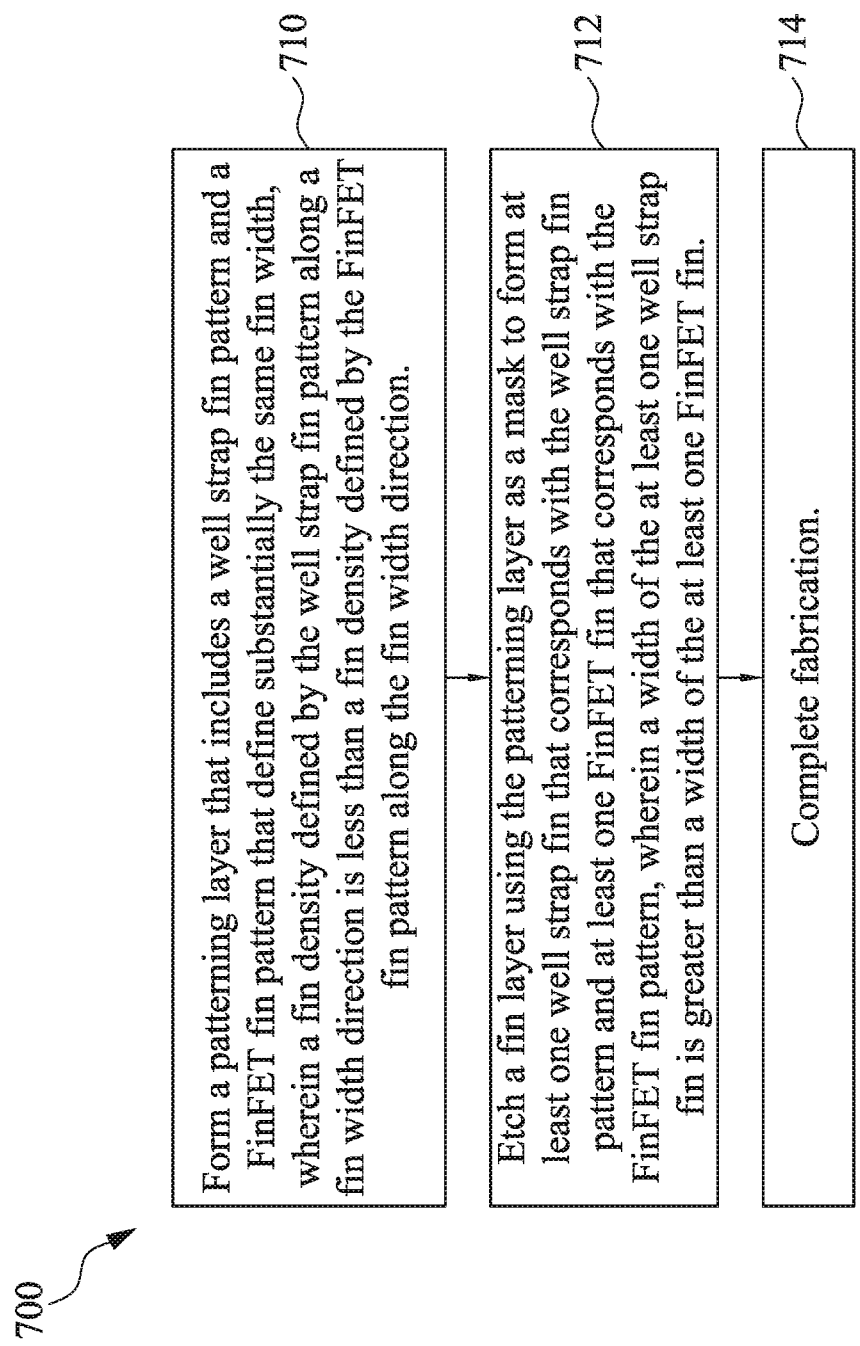
FIG. 8 is a flow chart of a method for fabricating a FinFET device according to various aspects of the present disclosure.

FIG. 8 is a flow chart of a method 700 for fabricating an IC device having fin configurations that optimize performance according to various aspects of the present disclosure. At block 710, method 700 includes forming a patterning layer that includes a well strap fin pattern and a FinFET fin pattern that define substantially the same fin width. A fin density defined by the well strap fin pattern along a fin width direction is less than a fin density defined by the FinFET fin pattern along the fin width direction. At block 712, method 700 includes etching a fin layer using the patterning layer as a mask. In some implementations, the fin layer is a substrate. In some implementations, the fin layer is a heterostructure disposed over a substrate. The etching forms at least one well strap fin that corresponds with the well strap fin pattern and at least one FinFET fin that corresponds with the FinFET fin pattern. A first width of the at least one well strap fin is greater than a second width of the at least one FinFET fin. In some implementations, a ratio of the first width to the second width is greater than about 1.1 and less than about 1.5. At block 714, method 700 can continue to complete fabrication of the IC device. For example, gate structures can be formed over a channel region of the at least one well strap fin and at least one FinFET fin as described herein, and epitaxial source/drain features can be formed over the source/drain regions of the at least one well strap fin and the at least one FinFET fin as described herein. Various contacts can also be formed to the gate structures and/or the epitaxial source/drain features. In some implementations, the various contacts are a portion of a multi-layer interconnect structure of the IC device. Additional steps can be provided before, during, and after method 700, and some of the steps described can be moved, replaced, or eliminated for additional embodiments of method 700.

The present disclosure provides for many different embodiments. Fin-based well straps are disclosed herein for improving performance of memory arrays, such as static random access memory arrays. Fin-based well straps are disclosed for improving performance of memory arrays, such as static random access memory arrays. An exemplary integrated circuit (IC) device includes a FinFET disposed over a doped region of a first type dopant. The FinFET includes a first fin having a first width doped with the first type dopant and first source/drain features of a second type dopant. The IC device further includes a fin-based well strap disposed over the doped region of the first type dopant. The fin-based well strap connects the doped region to a voltage. The fin-based well strap includes a second fin having a second width doped with the first type dopant and second source/drain features of the first type dopant. The second width is greater than the first width. In some implementations, a ratio of the second width to the first width is greater than about 1.1 and less than about 1.5. In some implementations, the FinFET is a first FinFET, the fin-based well strap is a first fin-based well strap, the doped region is a first doped region, and the voltage is a first voltage. In such implementations, the integrated circuit device further includes a second FinFET and a second fin-based well strap disposed over a second doped region of the second type dopant. The second fin-based well strap connects the second doped region to a second voltage. The second FinFET includes a third fin having a third width doped with the second type dopant and third source/drain features of the first type dopant. The second fin-based well strap includes a fourth fin having a fourth width doped with the second type dopant and fourth source/drain features of the second type dopant. The fourth width is greater than the third width. In some implementations, a ratio of the fourth width to the third width is greater than about 1.1 and less than about 1.5.

In some implementations, the FinFET includes a gate structure that traverses the first fin, such that the first gate structure is disposed between the first source/drain features. In some implementations, the fin-based well strap includes a second gate structure that traverses the second fin, such that the second gate structure is disposed between the second source/drain features. In some implementations, the first gate structure is an active gate structure and the second gate structure is a dummy gate structure. In some implementations, the integrated circuit device further includes a multi-layer interconnect (MLI) structure. The MLI structure includes a first device-level contact disposed on at least one of the first source/drain features, a second device-level contact disposed on at least one of the second source/drain features, a first via disposed on the first device-level contact, a second via disposed on the second device-level contact, and a first metal line. The first via electrically connects the at least one of the first source/drain features to the first metal line, and the second via electrically connects the at least one of the second source/drain features to the first metal line.

In some implementations, the first fin has a first dopant concentration of the first type dopant and the second fin has a second dopant concentration of the first type dopant. The second dopant concentration is greater than the first dopant concentration. In some implementations, the second dopant concentration is at least three times greater than the first dopant concentration. In some implementations, the doped region has a third dopant concentration of the first type dopant. The third dopant concentration is greater than the first dopant concentration and less than the second dopant concentration. In some implementations, the third fin has a fourth dopant concentration of the second type dopant and the fourth fin has a fifth dopant concentration of the second type dopant. The fifth dopant concentration is greater than the fourth dopant concentration. In some implementations, the fifth dopant concentration is at least three times greater than the fourth dopant concentration. In some implementations, the second doped region has a sixth dopant concentration of the second type dopant. The sixth dopant concentration is greater than the fourth dopant concentration and less than the fifth dopant concentration. In some implementations, the first type dopant is a p-type dopant and the second type dopant is an n-type dopant. In some implementations, the first type dopant is an n-type dopant and the second type dopant is a p-type dopant. In some implementations, the doped region has a third dopant concentration of the first type dopant.

An exemplary memory array includes a first row of well strap cells and a second row of well strap cells. The memory array further includes a plurality of memory cells arranged in columns and rows, wherein the plurality of memory cells are disposed between the first row of well strap cells and the second row of well strap cells. Each column of memory cells is disposed between a first well strap cell and a second well strap cell. Each of the memory cells include a FinFET disposed over a doped region of a first type dopant, wherein the FinFET includes a first fin having a first width doped with the first type dopant and first source/drain features of a second type dopant. The first well strap cell and the second well strap cell each include a fin-based well strap disposed over the doped region of the first type dopant, wherein the fin-based well strap includes a second fin having a second width doped with the first type dopant and second source/drain features of the first type dopant. The second width is greater than the first width. The fin-based well strap connects the doped region of the first type dopant to a voltage. In some implementations, a ratio of the second width to the first width is greater than about 1. In some implementations, the first fin has a first dopant concentration of the first type dopant and the second fin has a second dopant concentration of the first type dopant, wherein the second dopant concentration is at least three times greater than the first dopant concentration. In some implementations, at least one fin doped with the second type dopant is disposed adjacent to the first fin along a fin width direction, and no fin doped with the second type dopant is disposed adjacent to the second fin along the fin width direction. In some implementations, the plurality of memory cells include a first memory cell array and a second memory cell array, the memory array further comprising a third row of well strap cells disposed between the first memory cell array and the second memory cell array.

In some implementations, the FinFET is a first FinFET, the doped region is a first doped region, and the fin-based well strap is a first fin-based well strap. In such implementations, each of the memory cells can further include a second FinFET disposed over a second doped region of the second type dopant, wherein the second FinFET includes a third fin having a third width doped with the second type dopant and third source/drain features of the first type dopant. In such implementations, the first well strap cell and the second well strap cell can each further include a second fin-based well strap disposed over the second doped region, wherein the second fin-based well strap includes a fourth fin having a fourth width doped with the second type dopant and fourth source/drain features of the second type dopant. The fourth width is greater than the third width. The second fin-based well strap connects the second doped region to a second voltage. In some implementations, a ratio of the second width to the first width is about 1.1 to about 1.5 and a ratio of the third width to the fourth width is about 1.1 to about 1.5. In some implementations, the second FinFET is disposed adjacent to the first FinFET along a fin width direction, and the first fin-based well strap is not disposed adjacent to the second fin-based well strap along the fin width direction. In some implementations, the first fin has a first dopant concentration of the first type dopant, the second fin has a second dopant concentration of the first type dopant, the third fin has a third dopant concentration of the second type dopant, and the fourth fin has a fourth dopant concentration of the second type dopant. The second dopant concentration is at least three times greater than the first dopant concentration, and the fourth dopant concentration is at least three times greater than the third dopant concentration. In some implementations, the first FinFET is a pull-down transistor, and the second FinFET is a pull-up transistor.

Another exemplary method includes forming a patterning layer over a fin layer. The patterning layer includes a well strap fin pattern and a FinFET fin pattern that define substantially the same fin width. A fin density defined by the well strap fin pattern along a fin width direction is less than a fin density defined by the FinFET fin pattern along the fin width direction. The method further includes etching the fin layer using the patterning layer as a mask to form at least one well strap fin that corresponds with the well strap fin pattern and at least one FinFET fin that corresponds with the FinFET fin pattern. A width of the at least one well strap fin is greater than a width of the at least one FinFET fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure comprising:
   an n-well disposed between a first p-well and a second p-well along a first direction, wherein the n-well, the first p-well, and the second p-well extend along a second direction that is different than the first direction and the n-well, the first p-well, and the second p-well span a first region and a second region along the second direction;
   in the first region, a pass-gate FinFET and a pull-down FinFET disposed over the second p-well, wherein:
      the pass-gate FinFET and the pull-down FinFET include and share a first p-type semiconductor fin extending from the second p-well, wherein the first p-type semiconductor fin extends lengthwise along the second direction and the first p-type semiconductor fin has a first width along the first direction, and
      the pass-gate FinFET and the pull-down FinFET include n-type epitaxial source/drains disposed on the first p-type semiconductor fin; and
   in the second region, a dummy FinFET is disposed over the second p-well, wherein:
      the dummy FinFET includes a second p-type semiconductor fin extending from the second p-well, wherein the second p-type semiconductor fin extends lengthwise along the second direction and the second p-type semiconductor fin has a second width along the first direction,
      the dummy FinFET includes p-type epitaxial source/drains disposed on the second p-type semiconductor fin, and
      the second width is greater than the first width.

2. The memory structure of claim 1, wherein a ratio of the second width to the first width is greater than about 1.1 and less than about 1.5.

3. The memory structure of claim 1, wherein the p-type epitaxial source/drains are first p-type epitaxial source/drains and the dummy FinFET further includes:
   a third p-type semiconductor fin extending from the second p-well, wherein the third p-type semiconductor fin extends lengthwise along the second direction, the third p-type semiconductor fin has the second width along the first direction, and a spacing is along the first direction between the second p-type semiconductor fin and the third p-type semiconductor fin;
   second p-type epitaxial source/drains disposed on the third p-type semiconductor fin; and
   a source/drain contact disposed over one of the first p-type epitaxial source/drains and one of the second p-type epitaxial source/drains, wherein the source/drain contact extends along and spans the spacing between the second p-type semiconductor fin and the third p-type semiconductor fin along the first direction.

4. The memory structure of claim 1, wherein the dummy FinFET is a first dummy FinFET and the p-type epitaxial source/drains are first p-type epitaxial source/drains, and in the second region, the memory structure further includes a second dummy FinFET disposed over the first p-well, wherein:
   the second dummy FinFET includes a third p-type semiconductor fin extending from the first p-well, wherein the third p-type semiconductor fin extends lengthwise along the second direction and the third p-type semiconductor fin has the second width;
   the second dummy FinFET includes second p-type epitaxial source/drains disposed on the second p-type semiconductor fin; and
   a spacing is between the second p-type semiconductor fin and the third p-type semiconductor fin along the first direction and no semiconductor fins extend from the n-well in the spacing between the second p-type semiconductor fin and the third p-type semiconductor fin.

5. The memory structure of claim 1, wherein:
   the pass-gate FinFET further includes a first gate that wraps a first portion of the first p-type semiconductor fin having the first width, wherein the first gate extends lengthwise along the first direction and the first gate is disposed between respective n-type epitaxial source/drains along the second direction;
   the pull-down FinFET further includes a second gate that wraps a second portion of the first p-type semiconductor fin having the first width, wherein the second gate extends lengthwise along the first direction and the second gate is disposed between respective n-type epitaxial source/drains along the second direction; and
   the dummy FinFET further includes a third gate that wraps a portion of the second p-type semiconductor fin having the second width, wherein the third gate extends lengthwise along the first direction and the third gate is disposed between respective p-type epitaxial source/drains along the second direction.

6. The memory structure of claim 5, wherein the second gate extends over the n-well and the third gate extends over the n-well.

7. The memory structure of claim 1, wherein:
the dummy FinFET is a first dummy FinFET;
the n-type epitaxial source/drains are first n-type epitaxial source/drains and the p-type epitaxial source/drains are first p-type epitaxial source/drains;
the n-well, the first p-well, and the second p-well further span a third region along the second direction; and
the memory structure further includes:
  in the first region, a pull-up FinFET disposed over the n-well, wherein:
    the pull-up FinFET include a first n-type semiconductor fin extending from the n-well, wherein the first n-type semiconductor fin extends lengthwise along the second direction and the first n-type semiconductor fin has a third width along the first direction, and
    the pull-up FinFET includes second p-type epitaxial source/drains disposed on the first n-type semiconductor fin; and
  in the third region, a second dummy FinFET is disposed over the n-well, wherein:
    the second dummy FinFET includes a second n-type semiconductor fin extending from the n-well, wherein the second n-type semiconductor fin extends lengthwise along the second direction and the second n-type semiconductor fin has a fourth width along the first direction,
    the second dummy FinFET includes second n-type epitaxial source/drains disposed on the second n-type semiconductor fin, and
    the fourth width is greater than the third width.

8. The memory structure of claim 7, wherein a ratio of the fourth width to the third width is greater than about 1.1 and less than about 1.5.

9. The memory structure of claim 7, wherein the third width is the same as the first width and the fourth width is the same as the second width.

10. The memory structure of claim 7, wherein the third region is disposed between the first region and the second region along the second direction.

11. The memory structure of claim 1, wherein the pass-gate FinFET and the pull-down FinFET are single-fin FinFETs.

12. The memory structure of claim 1, wherein the first p-type semiconductor fin is aligned with the second p-type semiconductor fin along the second direction.

13. A memory structure comprising:
a p-well and an n-well disposed in a semiconductor substrate;
first p-type fin channels extending from the p-well, wherein the first p-type fin channels extend lengthwise along a first direction and widthwise along a second direction, wherein the first p-type fin channels have a first width along the second direction;
second p-type fin channels extending from the p-well, wherein the second p-type fin channels extend lengthwise along the first direction and widthwise along the second direction, wherein the second p-type fin channels have a second width along the second direction;
first n-type fin channels extending from the n-well, wherein the first n-type fin channels extend lengthwise along the first direction and widthwise along the second direction, wherein the first n-type fin channels have a third width along the second direction;
second n-type fin channels extending from the n-well, wherein the second n-type fin channels extend lengthwise along the first direction and widthwise along the second direction, wherein the second n-type fin channels have a fourth width along the second direction;
wherein a memory area of the memory structure includes at least one n-type FinFET formed from the first p-type fin channels extending from the p-well and first n-type source/drains disposed on the first p-type fin channels;
wherein the memory area of the memory structure includes at least one p-type FinFET formed from the first n-type fin channels extending from the n-well and first p-type source/drains disposed on the first n-type fin channels;
wherein a first well strap area of the memory structure includes at least one dummy n-type FinFET formed from the second p-type fin channels extending from the p-well and second p-type source/drains disposed on the second p-type fin channels;
wherein a second well strap area of the memory structure includes at least one dummy p-type FinFET formed from the second n-type fin channels extending from the n-well and second n-type source/drains disposed on the second n-type fin channels; and
wherein the second width is greater than the first width and the fourth width is greater than the third width.

14. The memory structure of claim 13, wherein the at least one n-type FinFET and the at least one p-type FinFET are single-fin FinFETs and the at least one dummy n-type FinFET and the at least one dummy p-type FinFET are two-fin dummy FinFETs.

15. The memory structure of claim 13, wherein the first well strap area is directly adjacent to the second well strap area.

16. The memory structure of claim 13, wherein the at least one n-type FinFET includes pass-gate transistors and pull-down transistors and the at least one p-type FinFET includes pull-up transistors, wherein the pass-gate transistors, the pull-down transistors, and the pull-up transistors are configured to provide a static random access memory cell.

17. The memory structure of claim 13, wherein:
a first spacing is along the second direction between a first one of the first p-type fin channels and a first one of the first n-type fin channels, wherein the first one of the first p-type fin channels is adjacent to the first one of the first n-type fin channels;
a second spacing is along the second direction between the first one of the first p-type fin channels and a second one of the first p-type fin channels, wherein the first one of the first p-type fin channels is adjacent to the second one of the first p-type fin channels;
a third spacing is along the second direction between a first one of the second p-type fin channels and a second one of the second p-type fin channels, wherein the first one of the second p-type fin channels is adjacent to the second one of the second p-type fin channels;
a fourth spacing is along the second direction between a first one of the second n-type fin channels and a second one of the second n-type fin channels, wherein the first one of the second n-type fin channels is adjacent to the second one of the second n-type fin channels; and
wherein the third spacing is greater than the first spacing and the fourth spacing is greater than the first spacing.

18. The memory structure of claim 17, wherein the third spacing is greater than the second spacing and the fourth spacing is greater than the second spacing.

19. A memory structure comprising:
a first p-well, a second p-well, a third p-well, a first n-well, and a second n-well that extend along a first direction, wherein the first n-well is between the first p-well and the second p-well along a second direction, the second n-well is between the second p-well and the third p-well along the second direction, and the second direction is different than the first direction;
a p-type well strap area that includes the first p-well, the second p-well, the third p-well, the first n-well, and the second n-well, wherein the p-type well strap area includes:
  a first p-type fin, a second p-type fin, a third p-type fin, and a fourth p-type fin arranged sequentially along the second direction, wherein the first p-type fin extends from the first p-well, the second p-type fin and the third p-type fin extend from the second p-well, and the fourth p-type fin extends from the third p-well,
  a first gate structure on the second p-type fin having a first width along the second direction and a second gate structure on the third p-type fin having the first width along the second direction,
  a first p-type epitaxial source/drain, a second p-type epitaxial source/drain, a third p-type epitaxial source/drain, and a fourth p-type epitaxial source/drain,
  wherein the first p-type epitaxial source/drain and the second p-type epitaxial source/drain are on the second p-type fin and the first gate structure is between the first p-type epitaxial source/drain and the second p-type epitaxial source/drain along the first direction,
  wherein the third p-type epitaxial source/drain and the fourth p-type epitaxial source/drain are on the third p-type fin and the second gate structure is between the third p-type epitaxial source/drain and the fourth p-type epitaxial source/drain along the first direction,
  a source/drain contact on the first p-type epitaxial source/drain and the third p-type epitaxial source/drain, wherein the source/drain contact is connected to a voltage and the source/drain contact spans a spacing between the second p-type fin and the third p-type fin along the second direction; and
a memory area that includes the first p-well, the second p-well, the third p-well, the first n-well, and the second n-well, wherein the memory area includes:
  a fifth p-type fin and a sixth p-type fin having the spacing therebetween along the second direction, wherein the fifth p-type fin and the sixth p-type fin extend from the second p-well,
  a third gate structure on the fifth p-type fin and the sixth p-type fin having a second width along the second direction that is less than the first width, a fourth gate structure on the fifth p-type fin having the second width along the second direction, and a fifth gate structure on the sixth p-type fin having the second width along the second direction,
  a first n-type epitaxial source/drain, a second n-type epitaxial source/drain, a third n-type epitaxial source/drain, a fourth n-type epitaxial source/drain, a fifth n-type epitaxial source/drain, and a sixth n-type epitaxial source/drain,
  wherein the first n-type epitaxial source/drain, the second n-type epitaxial source/drain, and the third n-type epitaxial source/drain are on the fifth p-type fin, the third gate structure is between the first n-type epitaxial source/drain and the second n-type epitaxial source/drain along the first direction, and the fourth gate structure is between the first n-type epitaxial source/drain and the third n-type epitaxial source/drain along the first direction, and
  wherein the fourth n-type epitaxial source/drain, the fifth n-type epitaxial source/drain, and the sixth n-type epitaxial source/drain are on the sixth p-type fin, the third gate structure is between the fourth n-type epitaxial source/drain and the fifth n-type epitaxial source/drain along the first direction, and the fifth gate structure is between the fourth n-type epitaxial source/drain and the sixth n-type epitaxial source/drain along the first direction.

20. The memory structure of claim 19, wherein the p-type well strap area and the memory area are a portion of a static random access memory.

\* \* \* \* \*